United States Patent
Hack et al.

(10) Patent No.: US 8,564,001 B2
(45) Date of Patent: Oct. 22, 2013

(54) ORGANIC LIGHT EMITTING DEVICE LIGHTING PANEL

(75) Inventors: Michael Hack, Princeton, NJ (US); Julia J. Brown, Yardley, PA (US); Peter Levermore, Lambertville, NJ (US); Michael S. Weaver, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 134 days.

(21) Appl. No.: 13/110,298

(22) Filed: May 18, 2011

(65) Prior Publication Data
US 2011/0284899 A1 Nov. 24, 2011

Related U.S. Application Data

(60) Provisional application No. 61/391,862, filed on Oct. 11, 2010, provisional application No. 61/347,092, filed on May 21, 2010.

(51) Int. Cl.
*H01L 33/50* (2010.01)
*H01L 21/00* (2006.01)

(52) U.S. Cl.
USPC ............ 257/98; 257/102; 257/103; 257/40; 257/E33.061; 438/82; 438/99; 438/22; 438/25

(58) Field of Classification Search
USPC ............ 438/82, 99, 22, 25; 257/98, 102, 103, 257/40, E33.061
See application file for complete search history.

(56) References Cited

U.S. PATENT DOCUMENTS

| | | | |
|---|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |

(Continued)

FOREIGN PATENT DOCUMENTS

| | | |
|---|---|---|
| EP | 1670082 | 6/2006 |
| WO | WO 2006/092964 | 9/2006 |

OTHER PUBLICATIONS

Search Report corresponding to the PCT/US2011/037165 application.

(Continued)

*Primary Examiner* — Thinh T Nguyen
(74) *Attorney, Agent, or Firm* — Sterne, Kessler, Goldstein & Fox P.L.L.C.

(57) ABSTRACT

A first device that may include one or more organic light emitting devices. At least 65 percent of the photons emitted by the organic light emitting devices are emitted from an organic phosphorescent emitting material. An outcoupling enhancer is optically coupled to each organic light emitting device. In one embodiment, the light panel is not attached to a heat management structure. In one embodiment, the light panel is capable of exhibiting less than a 10 degree C. rise in junction temperature when operated at a luminous emittance of 9,000 lm/m² without the use of heat management structures, regardless of whether the light panel is actually attached to a heat management structure or not. The light panel may be attached to a heat management structure. The light panel may be not attached to a heat management structure.

29 Claims, 11 Drawing Sheets

(56) References Cited

U.S. PATENT DOCUMENTS

| | | | |
|---|---|---|---|
| 6,087,196 | A | 7/2000 | Sturm et al. |
| 6,091,195 | A | 7/2000 | Forrest et al. |
| 6,097,147 | A | 8/2000 | Baldo et al. |
| 6,265,820 | B1 | 7/2001 | Ghosh et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,687,266 | B1* | 2/2004 | Ma et al. .......... 372/7 |
| 6,777,870 | B2 | 8/2004 | Sundahl |
| 7,009,338 | B2* | 3/2006 | D'Andrade et al. ......... 313/504 |
| 7,049,745 | B2 | 5/2006 | Cok |
| 7,205,718 | B2 | 4/2007 | Cok |
| 7,279,704 | B2 | 10/2007 | Walters et al. |
| 7,358,665 | B2 | 4/2008 | Yu et al. |
| 7,431,968 | B1 | 10/2008 | Shtein |
| 7,745,990 | B2* | 6/2010 | Kondo et al. ......... 313/504 |
| 2003/0230980 | A1 | 12/2003 | Forrest et al. |
| 2004/0032205 | A1* | 2/2004 | Hack et al. ......... 313/504 |
| 2004/0174116 | A1 | 9/2004 | Lu et al. |
| 2006/0125380 | A1* | 6/2006 | Nagara et al. ......... 313/504 |
| 2010/0033082 | A1 | 2/2010 | Liu et al. |

OTHER PUBLICATIONS

Baldo et al., "Highly Efficient Phosphorescent Emission from Organic Electroluminescent Devices," Nature, vol. 395, 151-154, 1998.

Baldo et al., "Very high-efficiency green organic light-emitting devices based on electrophosphorescence," Appl. Phys. Left., vol. 75, No. 3, 4-6 (1999).

Sun et al., "Enhanced light out-coupling of organic light-emitting devices using 30 embedded low-index grids", Nature Photonics, 2, 483 (2008).

S. Moller, S. R. Forrest, "Improved light out-coupling in organic light emitting diodes employing ordered microlens arrays", J Appl. Phys. 91, 3324 (2002).

N. Nakamura, N. Fukumoto, F. Sinapi, N. Wade, Y. Aoki, and K. Maeda, "Glass substrates for OLED lighting with high out-coupling efficiency," Soc. Informat. Disp. Tech. Digest, 603-606, 5 (2009).

T. Clausen and C. Dabruzi, 3M Display & Graphics Business Laboratory, "Substrates & Encapsulation & Light Out-coupling", DOE Solid-State Lighting Manufacturing Workshop, Jun. 2425, 2009, Vancouver, WA.

Chung, S. et al., "Substrate thermal conductivity effect on heat dissipation and lifetime improvement of organic light-emitting diodes," Applied Physics Letters 94 (2009) 253302-1-10 253302-3.

U.S. Department of Energy, Lighting Research and Development Building Technologies Program, Solid State Lighting Research and Development: Multi-Year Program Plan, Mar. 2010, pp. 1-136.

U.S. Department of Energy Solid State Light Manufacturing R&D Workshop Preparatory 15 Materials, ORBEOSTM for OLED Lighting, Preliminary Data, OSRAM, (Nov. 18, 2009) pp. 1-20.

Novaled demonstrates reliable OLEd's on metal substrates, Press Release, Dresden, Germany, Apr. 29, 2010.

Schwartz, G. et al., Triple Harvesting in Hybrid White Organic Light-Emitting Diodes, Adv. Funet. Mater. (2009) 19, 1319-1333.

Reineke, S. et al., White Organic Light-Emitting Diodes with Fluorescent Tube Efficiency, Nature (May 14, 2009) 459, 234-239.

Xiao, L. et al., Nearly 100% Internal Quantum Efficiency in an Organic Blue-Light Electrophosphorescent Device Using a Weak Electron Transporting Material with a Wide Energy Gap, Adv. Mater. (2009) 21, 1271-1274.

Williams, Evan et al., Excimer-Based White Phosphorescent Organic Light Emitting Diodes with Nearly 100% Internal Quantum Efficiency, Adv. Mater. (2007) 19, 197-202.

Wang, Q. et al., Harvesting Excitons Via Two Parallel Channels for Efficient White Organic LEDs with Nearly 100% Internal Quantum Efficiency: Fabrication and Emission-Mechanism Analysis, Adv. Funct. Mater. (2009) 19, 84-95.

Jeon, S. et al, Theoretical maximum quantum Efficiency in Red Phosphorescent Organic Light-5 Emitting Diodes at a Low Doping concentration Using a Spirobenzofluorene Type Triplet Host Material, Organic Electronics (2010) 11, 881-886.

Sun, Y. et al., Management of Singlet and Triplet Excitons for Efficient White Organic LightEmitting Devices, Nature (Apr. 13, 2006) 440, 908-912.

Sun, Y. et al., Multiple Exciton Generation regions in Phosphorescent White Organic Light Emitting Devices, Organic Electronics (2008) 9, 994-1001.

Jeon, W. et al, Low Roll-OffEfficiency Green Phosphorescent Organic Light-Emitting Devices with Simple Double Emissive Layer Structure, Applied Physics Letters (2008) 93, 063303-1-15 063303-3.

Mike Hack, "Pushing the Envelope for White OLED Efficiancies", UDC DOE R & Workshop, Feb. 4, 2009, San Francisco.

Lu et al., "Power Consumption and Temperature Increase in Large Area Active-Matrix OLED Displays", Journal of Display Technology, vol. 4, No. 1, Mar. 2008.

Kido's Paper at Plastic Electronics in Germany in Oct. 2009.

Komoda, Takuya, "New trend in OLED Lighting—High CRI OLED technology with high power efficiency", presented a OLED lighting panel at 7th Organic Semiconductor Conference, London, UK, Sep. 28-30, 2009.

ORBEOS for OLED Lighting, Preliminary Data, Nov. 18, 2009, pp. 1-20.

Franky So, University of Florida at 2010 DOE Solid-State Lighting R&D Workshop, held in Raleigh, North Carolina, on Feb. 2-4, 2010 (referring to a presentation by Junji Kido at Plastic Electronics 2007.

Zhou et al., Real-Time Observation of Temperature Rise and Thermal Breakdown Processes in Organic LEDs Using an IR Imaging and Analysis System, Advanced Materials, vol. 12:4 (2000)).

U.S. Appl. No. 13/047,221, filed Mar. 14, 2011.

* cited by examiner

ORGANIC LIGHT EMITTING DEVICE LIGHTING PANEL

This application claims priority to U.S. Provisional Application Ser. No. 61/347,092, filed May 21, 2010 and U.S. Provisional Application Ser. No. 61/391,862 filed Oct. 11, 2010, the disclosure of each of which is herein expressly incorporated by reference in their entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to lighting panels using organic light emitting devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the structure of Formula I:

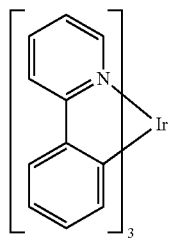

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

A first device is provided. The first device includes a light panel. The light panel further includes one or more organic light emitting devices. At least 65 percent of the photons emitted by the organic light emitting devices are emitted from an organic phosphorescent emitting material. The remaining photons may be emitted by an organic fluorescent emitting material. An outcoupling enhancer is optically coupled to each organic light emitting device.

In one embodiment, the light panel is not attached to a heat management structure.

In one embodiment, the light panel is capable of exhibiting less than a 10 degree C. rise in junction temperature when operated at a luminous emittance of 9,000 lm/m$^2$ without the use of heat management structures, regardless of whether the light panel is actually attached to a heat management structure or not. The light panel may be attached to a heat management structure. The light panel may be not attached to a heat management structure.

Various features described herein may be used in any combination with the devices and light panels described in the preceding paragraphs.

In one embodiment, all emitting materials in the one or more organic light emitting devices are phosphorescent emitters.

From an efficiency viewpoint, preferably all emitting materials in the one or more organic light emitting devices are organic phosphorescent emitting materials.

In one embodiment, at least one of the emitting materials in the one or more organic light emitting devices is an organic fluorescent emitting material having an emissive spectrum with a highest peak in the visible wavelength range between 400 nm and 500 nm. The use of a fluorescent emitter may not be preferred in general terms from a pure efficiency and panel temperature standpoint. But from a practical viewpoint, the use of blue emitting phosphorescent devices may involve a number of undesirable trade-offs, such that it is preferable to use some organic fluorescent emitting materials to obtain the blue component of a desired emission spectrum.

Preferably, each organic light emitting device has an internal quantum efficiency of 70 to 100 percent. More preferably, each organic light emitting device has an internal quantum efficiency of 90 to 100 percent.

Each phosphorescent OLED of the light panel has a highest energy emitting material, i.e., the emitting material that emits the highest energy photons, which may be defined by a peak in the emission spectrum. If there is only one emitting material, that emitting material is the "highest energy" emitting material. Where there is more than one emitting material, the "highest energy" emitting material is the emitting material with a peak in the emission spectrum at a higher energy (i.e., a lower wavelength). Preferably, the energy gap between highest LUMO through which an electron passes and the lowest HOMO through which a hole passes before forming an exciton on the emitting material having the highest energy peak is not more than 0.6 eV greater than the energy of the highest energy peak.

Preferably, the light panel has a luminous emittance of at least 9,000 lm/m$^2$. More preferably, the light panel has a luminous emittance of at least 15,000 lm/m$^2$.

Preferably, the light panel exhibits less than a 10 degree C. rise in junction temperature when operated at a luminous emittance of 9,000 lm/m$^2$ without the use of heat management structures.

Preferably at least one of the organic light emitting devices further includes first and second sublayers. The first sublayer has a first organic host and a first organic emitting dopant, where the first organic emitting dopant has a peak emissive wavelength in the visible range between 400 and 500 nm. The second sublayer is disposed adjacent to the first sublayer and closer to an anode of the first device than the first sublayer. The second sublayer has a second organic host different from the first organic host, a second organic emitting dopant having a peak emissive wavelength in the visible range between 500 and 600 nm; and a third organic emitting dopant having a peak emissive wavelength in the visible range between 600 and 700 nm.

The first device may be the light panel. The first device may be a consumer device, where the light panel is incorporated into the consumer device.

Preferably, the one or more organic light emitting devices are disposed on a substrate of a material selected from glass, plastic and metal.

Preferably, all structures directly attached to the light panel consist essentially of materials selected from the group of glass and plastic.

Preferably, the light panel has a panel area of at least 25 cm$^2$.

The first device may include one or more bus lines. Each organic emitting device may include a first electrode comprising a transparent conductive oxide. Every point on the first electrode is within 2 cm of a bus line to which the first electrode is electrically connected.

Preferably, the lighting panel has resistive power loss in bus lines and electrodes not more than 10%. More preferably, the lighting panel has resistive power loss in the bus lines and electrodes not more than 5%. Preferably, the lighting panel has resistive power loss in the electrodes not more than 2%.

Preferably, when the light panel is operated at 9,000 lm/m$^2$, it has a luminance uniformity <10% at a distance greater than 1.5 cm from the bus line to which the first electrode is electrically connected. More preferably, when the light panel is operated at 9,000 lm/m$^2$, it has luminance uniformity <10% at a distance greater than 1.5 cm from the bus line to which the first electrode is electrically connected and where the sheet resistance of the first electrode >10 Ω/sq.

Preferably, when the light panel is operated at 9,000 lm/m$^2$, it has a color rendering index ("CRI") (Ra) of at least 80 and a Duv less than 0.008.

A method is provided. For the method, a first device is provided. The first device includes a light panel. The light panel further includes one or more organic light emitting devices. At least 65 percent of the photons emitted by the organic light emitting devices are emitted from an organic phosphorescent emitting material. In one embodiment, all emitting materials in the one or more organic light emitting devices are phosphorescent emitters. An outcoupling enhancer is optically coupled to each organic light emitting device. The light panel is operated at a luminous emittance of at least 9,000 lm/m$^2$.

In one embodiment, the light panel is not attached to a heat management structure.

In one embodiment, the light panel is capable of exhibiting less than a 10 degree C. rise in junction temperature when operated at a luminous emittance of 9,000 lm/m$^2$ without the use of heat management structures, regardless of whether the light panel is actually attached to a heat management structure or not. The light panel may be attached to a heat management structure. The light panel may be not attached to a heat management structure.

Various features described herein may be used in any combination with the devices and light panels described in the preceding paragraphs.

"Luminous emittance" is a measure of the amount of light generated by a lighting panel, and is independent of measurement direction. An accurate measurement of luminous emittance should account for all light emitted by the lighting panel.

In one embodiment, at least 65 percent of the photons emitted by the organic light emitting devices are emitted from an organic phosphorescent emitting material. The remaining photons may be emitted by an organic fluorescent emitting material.

From an efficiency viewpoint, preferably all emitting materials in the one or more organic light emitting devices are organic phosphorescent emitting materials.

In one embodiment, at least one of the emitting materials in the one or more organic light emitting devices is an organic fluorescent emitting material having an emissive spectrum with a highest peak in the visible wavelength range between 400 nm and 500 nm. The use of a fluorescent emitter may not be preferred in general terms from a pure efficiency standpoint. But from a practical viewpoint, the use of blue emitting phosphorescent devices may involve a number of undesirable trade-offs, such that it is preferable to use some organic fluorescent emitting materials to obtain the blue component of a desired emission spectrum.

In one embodiment, a first device is provided. The device comprises a light panel. The light panel further comprises one or more organic light emitting devices, wherein at least 65 percent of the photons emitted by the organic light emitting devices are emitted from an organic phosphorescent emitting material. An outcoupling enhancer is optically coupled to each organic light emitting device. The light panel exhibits less than a 10 degree C. rise in junction temperature when operated at 9,000 lm/m$^2$ without the use of heat management structures.

In one embodiment, the first device may or may not be actually attached to a heat management structure, so long as the light panel exhibits less than a 10 degree C. rise in temperature when operated at 9,000 lm/m$^2$ without the use of heat management structures.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
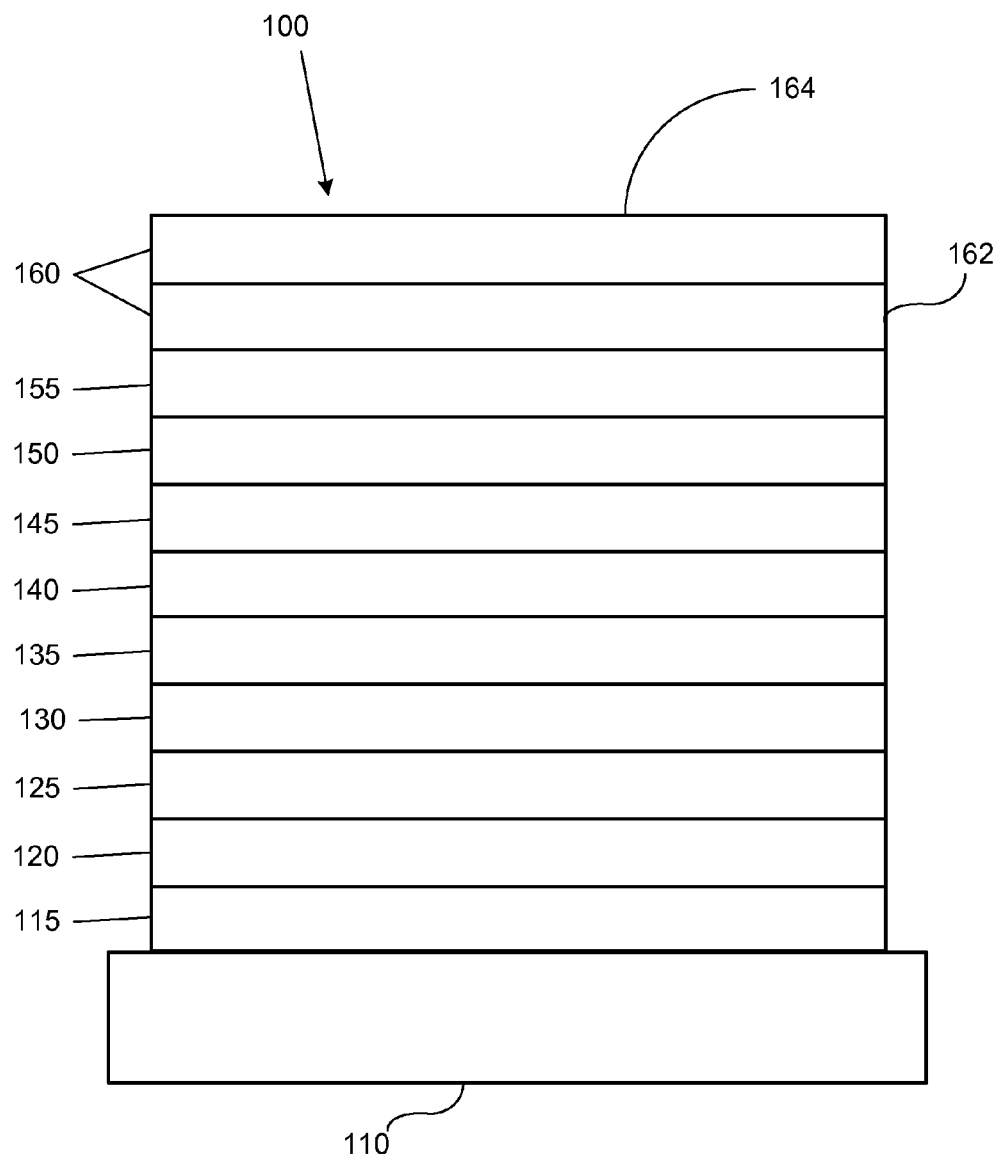
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
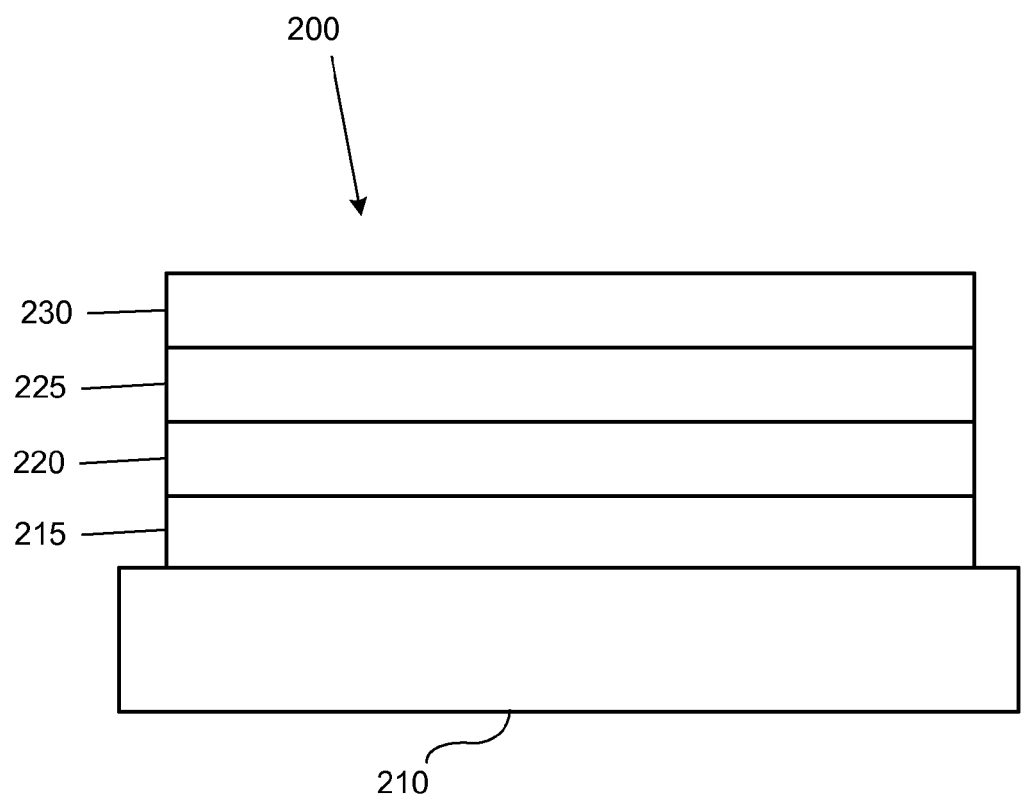
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistor's, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

A surprisingly low cost and simple structure for an OLED lighting panel having superior performance is provided.

A first device is provided. The first device includes a light panel. The light panel further includes one or more organic light emitting devices. At least 65 percent of the photons emitted by the organic light emitting devices are emitted from an organic phosphorescent emitting material. The remaining photons may be emitted by an organic fluorescent emitting material. An outcoupling enhancer is optically coupled to each organic light emitting device.

In one embodiment, the light panel is not attached to a heat management structure.

In one embodiment, the light panel is capable of exhibiting less than a 10 degree C. rise in junction temperature when operated at a luminous emittance of 9,000 lm/m$^2$ without the use of heat management structures, regardless of whether the light panel is actually attached to a heat management structure or not. The light panel may be attached to a heat management structure. The light panel may be not attached to a heat management structure.

Various features described herein may be used in any combination with the devices and light panels described in the preceding paragraphs.

In one embodiment, all emitting materials in the one or more organic light emitting devices are phosphorescent emitters.

From an efficiency viewpoint, and the desire to keep operating junction temperature as low as possible, preferably all emitting materials in the one or more organic light emitting devices are organic phosphorescent emitting materials.

In one embodiment, at least one of the emitting materials in the one or more organic light emitting devices is an organic fluorescent emitting material having an emissive spectrum with a highest peak in the visible wavelength range between 400 nm and 500 nm. The use of a fluorescent emitter may not be preferred in general terms from pure efficiency/temperature standpoints. But from a practical viewpoint, the use of blue emitting phosphorescent devices may involve a number of undesirable trade-offs, such that it is preferable to use some organic fluorescent emitting materials to obtain the blue component of a desired emission spectrum. Even when up to 35% of the photons emitted by the OLEDs that make up a lighting panel are due to fluorescent emitters, substantial advantages due to the phosphorescent emitters are still expected based on the description herein.

One way to estimate the proportion of photons exiting the light panel that are emitted from phosphorescent emitters is to examine the excited state lifetime of the emissive materials, and to measure the proportion of photons with excited state lifetime >100 ns. A simple way of determining this would be to apply a voltage pulse and measure the spectrum during the pulse. This is the "total emission spectrum". A gate could then be used to measure the spectrum at particular time intervals after the end of the voltage pulse. For example, the spectrum could be measured at time >100 ns—this would be the "phosphorescent emission spectrum". Such measurements could easily be used to determine the proportion of photons emitted with excited state lifetime >100 ns. For purposes of this application only, it may be assumed that organic phosphorescent materials have radiative lifetimes greater than 100 ns, and that organic fluorescent materials have radiative lifetimes less than 100 ns. While this categorization based on radiative lifetime is a reasonable general rule that applies to almost all relevant materials and provides a practical way to measure how much of the emission from a device is due to phosphorescent emission, the inventors are not seeking to define the terms "phosphorescent" and "fluorescent" In addition, a claim may be written without using the terms "phosphorescent" or "fluorescent," but rather in terms of whether at least 65 percent of the photons have a radiative lifetime of 100 ns or more.

As used herein, a "heat management structure" refers to any structure that significantly increases the heat dissipated from a light panel relative to a "standard" light panel consisting of a device fabricated on a substrate. "Significant" in this context is an increase of 10% or more in the energy per unit area due to the presence of a heat management structure, as compared to an otherwise identical device fabricated on the same substrate. The use of a particular substrate, such as metal instead of glass or plastic, is not considered a heat management structure. An outcoupling enhancer is not considered a heat management structure. An electric current-carrying bus line is not considered a heat management structure, but metal lines present for the sole purpose of conducting heat may be considered a heat management structure. Heat management structures may be active, such as a fan or a plate with channels for circulation of coolant, or passive, such as a metal block with fins or a sheet with a high thermal emissivity coefficient, where "high" is relative to structures present for reasons not related to thermal management.

As used herein, an "outcoupling enhancer" is a structure that increases the outcoupling of light generated by the OLED by at least 25% relative to a standard OLED. A "standard" OLED is fabricated on a flat substrate, and has flat electrodes. It is generally accepted in the community that a standard OLED outcouples about 20% of the light generated by the OLED. The rest of the light is lost due to waveguiding, reflection, and/or absorption. Many structures are known to the art for increasing outcoupling, including the use of high index substrates, macroextractors, microlenses or surface scattering layers, the use of microcavities, and/or the use of an integrated low index grid. An outcoupling enhancer may be attached to an OLED, such as a microlens, or may be a feature integrated into the OLED, such as a microcavity. An increase of 25% in outcoupling relative to a standard OLED having 20% outcoupling (in the absence of enhancement) would result in outcoupling of 25% instead of 20%, because 20% times 1.25=25%. An increase of outcoupling of 25% may be readily obtained using widely known structures such as microlenses and/or other structures described above. Published examples include:

Y. Sun and S. R. Forrest, "Enhanced light out-coupling of organic light-emitting devices using embedded low-index grids", *Nature Photonics*, 2, 483 (2008).

S. Moller, S. R. Forrest, "Improved light outcoupling in organic light emitting diodes employing ordered microlens arrays", *J. Appl. Phys.* 91, 3324 (2002).

N. Nakamura, N. Fukumoto, F. Sinapi, N. Wade, Y. Aoki, and K. Maeda, "Glass substrates for OLED lighting with high out-coupling efficiency," *Soc. Informat. Disp. Tech. Digest,* 603-606 (2009).

T. Clausen and C. Dabruzi, 3M Display & Graphics Business Laboratory, "Substrates & Encapsulation & Light Outcoupling", *DOE Solid-State Lighting Manufacturing Workshop,* 24-25 Jun. 2009, Vancouver, Wash.

Preferably, each organic light emitting device has an internal quantum efficiency of 70 to 100 percent. More preferably, each organic light emitting device has an internal quantum efficiency of 90 to 100 percent. Most preferably, each organic light emitting device has an internal quantum efficiency of about 100 percent.

Each phosphorescent OLED of the light panel has an emitting material that has an emission spectrum with the highest energy peak of the emitting materials that may be present in the phosphorescent OLED. This emitting material may be the single emitting material of an OLED that has only one emitting material. Preferably, the energy gap between highest LUMO through which an electron passes and the lowest HOMO through which a hole passes before forming an exciton on the emitting material having the highest energy peak is not more than 0.6 eV greater than the energy of the highest energy peak. HOMO and LUMO levels for various organic materials that are commonly used in OLEDs are published, or may be readily calculated using commercially available programs such as a DFT Gaussian 03 platform. This material selection criteria helps reduce or minimize the amount of energy lost to heat as electrons and holes form excitons in the device.

Preferably, the light panel is capable of a luminous emittance of at least 9,000 lm/m$^2$. More preferably, the light panel is capable of a luminous emittance of at least 15,000 lm/m$^2$.

Preferably, the light panel exhibits less than a 10 degree C. rise in junction temperature when operated at a luminous emittance of at least 9,000 lm/m² without the use of heat management structures.

Luminous emittance (lm/m²) as used herein is defined as the total number of lumens emitted by the OLED panel divided by the panel area. Here the panel area is the area of a surface defined by the outline of the active emissive area, and includes both active emissive area and the areas in between. The panel area is likely to be smaller than the substrate area, which includes non-emissive areas around the edges of the panel that may be needed for encapsulation, electrical connections, mechanical mounting etc.

As used herein, the term "junction temperature" refers to the highest temperature of the actual semiconductor in an electronic device. In operation, junction temperature is typically higher than the exterior temperature of the electronic device. For example, for an OLED light panel, junction temperature is typically higher than surface temperature. For an OLED light panel area with uniform cross-section (e.g. a panel area that comprises a single large area pixel), the difference between junction temperature and surface temperature is proportional to the product of the power dissipation and thermal resistance within the device. However, where the panel area has a non-uniform cross section, (e.g. a panel area that comprises individual active emissive areas separated by non-emissive bus line areas), an additional correction is needed to account for the non-emissive panel area. In an OLED light panel, junction temperature may be broadly defined as the temperature within the organic stack, and in particular, within the emissive layer s (EMLs) or directly adjacent to the EMLs. Junction temperature may be different at different locations within the panel area, owing to luminance non-uniformity and changes in heat dissipation.

One method that may be used to predict or determine the junction temperature of the organic emissive panel at different locations is to measure the surface temperature of the panel above emissive regions of the device. This method is described below. Surface temperature measurements are typically lower than the actual junction temperature (for reasons described below), but may generally be used to estimate the junction temperature for some OLED devices.

For the exemplary embodiment and testing described below, for each panel, the surface temperature was measured on the emissive surface of the OLED lighting panel at a point directly above the active emissive region in the center of the active emissive region. Surface temperature was recorded using a K-type thermocouple after allowing several minutes for the measurement to stabilize. For the OLED lighting panels measured in this application, a light extraction layer of thickness <0.5 mm was optically connected to the substrate surface. Temperature measurements were taken on the surface of the light extraction layer. For the exemplary device, the light extraction layer is thin with high thermal conductivity. The temperature on the surface of the light extraction layer is known to be approximately the same as the temperature at the substrate surface (temperature at substrate surface is <0.2 degree C. higher), based on other experiments comparing devices with and without the light extraction layer, and may therefore in certain embodiments be used as an approximation for the junction temperature.

To the extent that some panels may include thick, thermally insulating layers, perhaps for encapsulation or light extraction, the surface temperature of the lighting panel may be different from the temperature at the exterior surface of the insulating layer. In this situation, the junction temperature of the lighting panel may be obtained by removing the insulating layer, or by indirect measurement and/or calculation. One such method, described in more detail in U.S. application Ser. No. 13/047,221, which is commonly assigned and herein incorporated by reference in its entirety, is discussed below with regards to an exemplary testing. However, any such method, including, for instance, characterization of emission spectra at different temperatures (see e.g. Tessler et al., *Current Heating in Polymer Light Emitting Diodes*, Applied Physics Letters, Vol. 73:6 (Aug. 10, 1998)); and infrared (IR) imaging (see, e.g. Zhou et al., *Real-Time Observation of Temperature Rise and Thermal Breakdown Processes in Organic LEDs Using an IR Imaging and Analysis System*, Advanced Materials, Vol. 12:4 (2000)), each of which is hereby incorporated by reference, may be used to determine junction temperature.

It should be noted that in the applications to which this application claims priority, the surface temperature of the exemplary device was a relatively accurate approximation of the junction temperature of the device, and therefore the measured values of the surface temperature were thereby referred to as the "temperature of the device." Thus, the use of the junction temperature herein (and as shown below) is entirely consistent with the findings presented therein. Indeed, the use of alternative methods to determine the junction temperature confirms the approximation of the use of the surface temperature in the priority applications.

Preferably at least one of the organic light emitting devices further includes first and second sublayers. The first sublayer has a first organic host and a first organic emitting dopant, where the first organic emitting dopant has a peak emissive wavelength in the visible range between 400 and 500 nm. The second sublayer is disposed adjacent to the first sublayer and closer to an anode of the first device than the first sublayer. The second sublayer has a second organic host different from the first organic host, a second organic emitting dopant having a peak emissive wavelength in the visible range between 500 and 600 nm; and a third organic emitting dopant having a peak emissive wavelength in the visible range between 600 and 700 nm.

The first device may be the light panel. The first device may be a consumer device, where the light panel is incorporated into the consumer device.

Preferably, the one or more organic light emitting devices are disposed on a substrate of a material selected from glass, plastic and metal.

Preferably, all structures directly attached to the light panel consist essentially of materials selected from the group of glass and plastic.

Preferably, the light panel has a panel area of at least 25 cm². At this size and larger, high light panel operating junction temperatures are more likely to be an issue than with smaller panels that may be useful in a laboratory for experimental purposes, but not as well suited for commercial purposes.

Preferably, the light panel has devices with emissive spectrums selected such that the CRI (Ra) of the light panel is greater than or equal to 80. 100 is the maximum CRI. A CRI (Ra) greater than 80 may be readily achieved by using several different types of devices that emit different colors, such as red, green and blue stripes, or by a single device with multiple emissive materials. 80 is a relatively modest target for CRI (Ra) that may be readily achieved using known phosphorescent emitting materials. Additionally, it is desirable that the total emission spectrum from the light panel is closely matched to a blackbody radiator. This can be quantified in terms of Duv=$\sqrt{(\Delta u'^2+\Delta v'^2)}$, which is distance in CIE 1976 (u', v') color space of the light panel chromaticity from the blackbody curve. The CIE 1976 (u', v') color space is used in preference over the CIE 1931 (x, y) color space because in the CIE 1976 (u', v') color space distance is approximately proportional to perceived difference in color. The conversion is very simple: u'=4x/(−2x+12y+3) and v'=9y/(−2x+12y+3). For a light panel, a Duv<0.010 is preferred, and a Duv<0.005 is more preferred. Preferably, when the light panel is operated at 9,000 lm/m$^2$, it has a CRI (Ra) of at least 80 and a Duv less than 0.008. These parameters may be readily achieved using architectures disclosed herein and variations thereof.

The first device may include one or more bus lines. Each organic emitting device may include a first electrode comprising a transparent conductive oxide. Every point on the first electrode is within 2 cm of a bus line to which the first electrode is electrically connected.

Preferably, the lighting panel has resistive power loss in bus lines and electrodes not more than 10%. More preferably, the lighting panel has resistive power loss in the bus lines and electrodes not more than 5%. Preferably, the lighting panel has resistive power loss in the electrodes not more than 2%. These parameters may be readily obtained, and have been demonstrated, by using the structures and calculations disclosed herein.

Preferably, when the light panel is operated at 9,000 lm/m$^2$, it has a luminance uniformity <10% at a distance greater than 1.5 cm from the bus line to which the first electrode is electrically connected. More preferably, when the light panel is operated at 9,000 lm/m$^2$, it has luminance uniformity <10% at a distance greater than 1.5 cm from the bus line to which the first electrode is electrically connected and where the sheet resistance of the first electrode >10 Ω/sq. These parameters may be readily obtained, and have been demonstrated, by using the structures and calculations disclosed herein.

A method is provided. For the method, a first device is provided. The first device includes a light panel. The light panel further includes one or more organic light emitting devices. At least 65 percent of the photons emitted by the organic light emitting devices are emitted from an organic phosphorescent emitting material. The remaining photons may be emitted by an organic fluorescent emitting material. In one embodiment, all emitting materials in the one or more organic light emitting devices are phosphorescent emitters. An outcoupling enhancer is optically coupled to each organic light emitting device. The light panel is operated at a luminous emittance of at least 9,000 lm/m$^2$.

In one embodiment, the light panel is not attached to a heat management structure.

In one embodiment, the light panel is capable of exhibiting less than a 10 degree C. rise in surface temperature and/or junction temperature when operated at a luminous emittance of 9,000 lm/m$^2$ without the use of heat management structures, regardless of whether the light panel is actually attached to a heat management structure or not. Note that the use of the and/or language is to illustrate that for some embodiments, the surface temperature may be a good approximation of the junction temperature. The light panel may be attached to a heat management structure. The light panel may be not attached to a heat management structure.

Various features described herein may be used in any combination with the devices and light panels described in the preceding paragraphs.

In one embodiment, a first device is provided. The device comprises a light panel. The light panel further comprises one or more organic light emitting devices, wherein at least 65 percent of the photons emitted by the organic light emitting devices are emitted from an organic phosphorescent emitting material. An outcoupling enhancer is optically coupled to each organic light emitting device. The light panel exhibits less than a 10 degree C. rise in surface temperature and/or junction temperature when operated at 9,000 lm/m$^2$ without the use of heat management structures.

In various embodiments, the lighting panel may or may not be actually attached to a heat management structure, so long as the light panel exhibits less than a 10 degree C. rise in surface temperature and/or junction temperature when operated at 9,000 lm/m$^2$ without the use of heat management structures.

As used herein, an "OLED lighting panel" is a panel used for general illumination purposes, in contrast, for example, to an OLED display panel. There are many differences between OLED lighting panels and display panels. Display panels are used to display images. As a result, smaller devices corresponding to the pixels of the display panel are generally desirable to achieve higher resolutions, and it is also desirable to have pixels with a relatively low aspect ratio so that both vertical and horizontal resolution may be obtained. Also, in a display panel, it is generally desired to independently control the on-off state and intensity of each pixel. In a lighting panel, larger devices are generally desirable to achieve higher fill factors and high total light output, and it is less desirable to independently control whether different devices are on or off, except perhaps as a way to control intensity. Also, for many uses of a lighting panel, a high Color Rendering Index (CRI) is desirable, while CRI is a lesser consideration in a display panel. CRI is generally reported in terms of general CRI, which is usually denoted by Ra. Conversely, achieving specific CIE coordinates is desirable for the different color devices of a full color display, whereas specific CIE coordinates are a lesser consideration for a lighting panel.

As OLED technology is scaled to panel areas useful for general illumination purposes, thermal issues arise. Local heating on a lighting panel can cause illumination non-uniformities and significantly reduce panel lifetimes. Recently, thermal issues with OLED lighting panels have become more pronounced, as the desired luminous emittance has been increased from 3,000 lm/m$^2$ to now 9,000 lm/m$^2$ or even 15,000 lm/m$^2$ to enable OLED lighting panels to be competitive with currently existing fluorescent light fixtures. But, at these higher luminance levels, thermal issues may be pronounced.

To achieve desirably low panel operational temperatures (i.e. low junction temperature to minimize thermally accelerated degradation of the organic materials, and/or low surface temperature to ensure the panel is cool to touch), the industry is proposing to add heat sinking into the panel structure, as described in U.S. Pat. No. 6,265,820. Komoda of PEW presented a OLED lighting panel at 7th Organic Semiconductor Conference, London, UK, 28-30 Sep. 2009, where Heat Radiation Technology is used to ensure OLED panel surface temperature=55 degrees C. at 2,000 nits. Even with use of the new technology, the reported surface temperature is very high. Also, the industry reports that OLED lighting panels without such heat sinking may have a high operating junction temperature. Other references describing heat management include:

Chung, S. et al., *Substrate thermal conductivity effect on heat dissipation and lifetime improvement of organic light-emitting diodes*, Applied Physics Letters 94 (2009) 253302-1-253302-3.

U.S. Department of Energy, Lighting Research and Development Building Technologies Program, *Solid State Lighting Research and Development: Multi-Year Program Plan*, March 2010, pp. 1-136.

U.S. Department of Energy Solid State Light Manufacturing R&D Workshop *Preparatory Materials,* ORBEOS™ for OLED Lighting, Preliminary Data, OSRAM, (2009 Nov. 18) pp. 1-20.

Novaled demonstrates reliable OLEDs on metal substrates, Press Release, Dresden, Germany, 29 Apr. 2010.

Franky So, University of Florida at 2010 DOE Solid-State Lighting R&D Workshop, held in Raleigh, N.C., on Feb. 2-4, 2010 (referring to a presentation by Junji Kido at Plastic Electronics 2007).

U.S. Pat. No. 6,265,820 to Ghosh et al.

U.S. Pat. No. 7,205,718 to Cok.

U.S. Pat. No. 6,777,870 to Sundahn.

U.S. Pat. No. 7,049,745 to Cok.

However, heat sinking apparatus, or more generally any heat management structure, may significantly add to the cost, weight, and/or thickness of an OLED lighting panel.

The tolerability of heat management structures is another area where differences between OLED lighting panels and OLED display panels are apparent. Display panels, particularly larger display panels, tend to be used in higher-end consumer products. In that context, it may be reasonable from a design and economic point of view to add somewhat to the cost in order to incorporate heat management structures, and still be competitive with other technologies. However, in a phosphorescent OLED lighting panel, which competes in the marketplace with various types of light bulbs in addition to technologies such as fluorescent OLED lighting panels, the cost of adding a heat management structure may be relatively more significant.

The inventors have shown that, by using phosphorescent OLED technology with high internal quantum efficiency, heating from non-radiative decay of exciton states can be almost entirely removed. Preferably, the internal quantum efficiency of all phosphorescent devices is at least 70%, more preferably at least 90%, and most preferably about 100%. 100% is the top of any range for internal quantum efficiency. The use of high internal quantum efficiency phosphorescent OLEDs enables lower temperatures than for equivalent fluorescent OLED panels, which inherently generate a significant amount of heat due to the presence of excitons that can not emit light, and that decay via other mechanisms that generally involve the generation of heat. Furthermore, the lower current that is required to drive a PHOLED lighting panel will reduce $I^2R$ power loss and associated heat generation in distributing charge throughout the panel area.

Phosphorescent OLEDs having the described internal quantum efficiency are known to the art and may be readily achieved. Examples from the literature include devices disclosed in the following references:

Schwartz, G. et al., *Triple Harvesting in Hybrid White Organic Light-Emitting Diodes*, Adv. Funct. Mater. (2009) 19, 1319-1333.

Reineke, S. et al., *White Organic Light-Emitting Diodes with Fluorescent Tube Efficiency*, Nature (14 May 2009) 459, 234-239.

Xiao, L. et al., *Nearly 100% Internal Quantum Efficiency in an Organic Blue-Light Electrophosphorescent Device Using a Weak Electron Transporting Material with a Wide Energy Gap*, Adv. Mater. (2009) 21, 1271-1274.

Williams, Evan et al., *Excimer-Based White Phosphorescent Organic Light Emitting Diodes with Nearly 100% Internal Quantum Efficiency*, Adv. Mater. (2007) 19, 197-202.

Wang, Q. et al., *Harvesting Excitons Via Two Parallel Channels for Efficient White Organic LEDs with Nearly 100% Internal Quantum Efficiency: Fabrication and Emission-Mechanism Analysis*, Adv. Funct. Mater. (2009) 19, 84-95.

Jeon, S. et al, *Theoretical maximum quantum Efficiency in Red Phosphorescent Organic Light-Emitting Diodes at a Low Doping concentration Using a Spirobenzofluorene Type Triplet Host Material*, Organic Electronics (2010) 11, 881-886.

Sun, Y. et al., *Management of Singlet and Triplet Excitons for Efficient White Organic Light-Emitting Devices*, Nature (13 Apr. 2006) 440, 908-912.

Baldo, M. et al., *Highly Efficient Phosphorescent Emission From Organic Electroluminescent Devices*, Nature (10 Sep. 1998) 395, 151-154.

Sun, Y. et al., *Multiple Exciton Generation regions in Phosphorescent White Organic Light Emitting Devices*, Organic Electronics (2008) 9, 994-1001.

Jeon, W. et al, *Low Roll-Off Efficiency Green Phosphorescent Organic Light-Emitting Devices with Simple Double Emissive Layer Structure*, Applied Physics Letters (2008) 93, 063303-1-063303-3.

Many of these references describe a combination of the desired internal quantum efficiency with a device having a desired high CRI.

In addition, the use of an outcoupling enhancer optically coupled to each device further reduces heat generation. In a standard device configuration without any outcoupling enhancement, about 20% of the photons generated escape the device to generate light for a viewer. The remainder are reflected, waveguided and/or absorbed in a way that generally results in the generation of heat. Outcoupling enhancement may be used to reduce the generation of such heat. This reduces or avoids the cost and complications of embedding heat removal apparatus within the OLED panel and contributes to a design where, at a luminous emittance of at 9,000 lm/m$^2$ and even 15,000 lm/m$^2$, the heat rise on a lighting panel can be ≤10 degrees C.

As OLED lighting panels are being developed for general illumination applications, and are being designed for luminous emittance of 9,000 lm/m$^2$ to 15,000 lm/m$^2$, the industry is considering means to lower the operating surface temperature and/or junction temperature of these panels through the use of structures added to lower the panel temperature. The proposed apparatus to remove additional heat from these panels adds cost, thickness, weight and complexity to the panels, and is undesirable. One reason to have the panels operate at close to room temperature is to extend panel lifetime. OLEDs degrade, especially at high luminances and at elevated temperatures. Maintaining a low operating junction temperature is therefore desirable. As a general rule, OLED degradation is a chemical reaction having a rate that is dependent upon junction temperature. A previous study by Ishii and Taga has shown that for every 10 degree C. rise in ambient temperature, device lifetime is reduced by approximately a factor of 1.8.

The inventors have found that by using high efficiency phosphorescent OLED technology to make OLED lighting panels, that even at a luminous emittance of 9,000 lm/m$^2$ to 15,000 lm/m$^2$, the operating rise in surface temperature and the operating rise in junction temperature can both be less than 10 degrees C., without the incorporation of any additional heat management structures. This is unexpected. A rise in junction temperature of 10 degree C. or less will extend panel lifetime and rise in surface temperature of 10 degree C. or less will ensure that the panels are not too hot to be touched.

Moreover the lower current requirement of PHOLED devices will lead to improved panel uniformity for any given panel layout.

Another advantage of low panel junction temperature enabled by this invention, is that more of the drive electronics could be incorporated on to the panel itself. As the drive electronics will produce heat, in a conventional OLED lighting panel, any additional circuitry placed on the panel will lead to increased temperature rise with loss of lifetime and hence panel uniformity. A PHOLED panel with lower operating junction temperature can withstand additional heat generated on the panel by drive electronics, without causing it to exceed a level at which the lifetime would be significantly reduced and non-uniformities to become apparent e.g. 10 degrees C.

Preferably, the power loss due to the resistance of bus lines on a PHOLED lighting panel and the PHOLED electrodes is 5% or less for each, or more generally less than 10% total. Resistive power loss results in undesirable heat generation. As panel area increases, resistive power loss as a percentage also generally increases for otherwise similar bus line and electrode configurations, because the average charge carrier travels further along a resistive path.

Here, "resistive power loss" is defined as the loss in efficacy (measured in lm/W) arising from the transportation of charge from electrode contacts between the panel and the outside world, to the active emissive area of the OLEDs. This can be thought of as the difference in efficacy between a large area light panel with resistive power loss and an equivalent small area pixel with negligible resistive power loss. One way to estimate this power loss is to compare the voltages of a large area light panel and an equivalent small area pixel when operating at the same current density. The active area of the small area pixel and large area light panel should be calculated, and both should be operated at the current density that produces 9,000 lm/m$^2$ for the panel, as measured by an integrating sphere inclusive of all light extraction enhancement. For the same organic device stack and light extraction enhancement, light output per unit current per unit area is approximately constant, so the difference in efficacy arises only from a change in operating voltage. The difference in operating voltage in delivering the same current density can therefore be used to estimate the resistive power loss. So, of a total resistive power loss <10%, the voltage of the panel should be no more than 10% higher than the voltage of an equivalent small area pixel.

As used herein, a small area pixel is "equivalent" to a large area panel if (1) the organic stack of the small area pixel consists essentially of the organic layers of the organic stack of the large area panel; (2) the organic stack of the small area pixel is structurally equivalent to the organic stack of the large area panel; and/or (3) the organic stack of the small area pixel is functionally equivalent to the organic stack of the large area panel.

As used herein, the organic stack of a small area pixel "consists essentially of" the organic layers of the organic stack of a large area panel if the organic stack of the small area pixel is expected to have a similar JVL characteristic (where "J" is current density and "V" is voltage and "L" is luminance) as the organic stack of the large area panel. That is, the organic stack of the small area pixel will perform in the same way as the organic stack in the large area pixel. By using this terminology, it is intended to encompass a situation where devices are not exactly identical, but the differences comprise, for instance, only a slight change to the thickness of a layer; a slight modification to a concentration of one of the layers; a material substitution with a material known to behave in the same way, and/or other small modifications such that a person of ordinary skill in the art would understand that the devices would function the same way for purposes of lifetime testing. These situations, and other differences that do not materially affect the characteristics and function of the device, are intended to be covered by this language.

As used herein, a first organic stack is "structurally equivalent" to a second organic stack if the first organic stack comprises materials that are the same as the second organic stack, and the thickness and concentrations levels of these materials (while not necessarily precisely identical) are within experimental error. For instance, the thickness and concentrations of each of the layers of the first organic stack may be within 5% of the corresponding layers in the second organic stack.

As used herein, a first organic stack is "functionally equivalent" to a second organic stack if the first organic stack comprises the same layers as the second organic stack, with only variations that do not significantly affect the JVL characteristics of the organic stack. The variations may be in any form, by way of example, differences in thickness, concentrations, and/or material. If one of skill in the art believes that lifetime data from one device can reasonably be used to predict the lifetime of another device that is expected to have a similar lifetime, the devices are "functionally equivalent."

Resistive power loss in a PHOLED lighting panel has two primary components: (1) loss due to sheet resistance in the OLED electrodes, and (2) loss due to charge transport along a bus line. Power loss due to sheet resistance in the OLED electrodes occurs primarily in transparent electrodes. For the most common OLED configuration, which as an ITO anode (or other transparent conductive oxide) disposed on a substrate, and a metal cathode, the resistive power loss due to sheet resistance in the OLED electrodes is almost all in the anode, and it is reasonable to neglect the resistance of the cathode in calculations.

As pixel size increases, the sheet resistance of the anode causes potential drops that lead to $I^2R$ power losses. Resistive power losses can be reduced if the TCO sheet is divided into smaller individual "pixels" that are surrounded by high-conductivity bus lines. Bus line width, thickness and material choice may be optimized to minimize resistive power losses. However, the charge transportation along additional bus lines associated with smaller pixels also generates heat.

Basic modeling and simple calculations can be used to determine:

a) Desirable maximum dimensions of each "pixel"
b) Desirable dimensions and materials for the bus lines that supply current to each "pixel"

The basic modeling makes an assumption that current is uniform throughout the panel architecture. This assumption is a "worst case" scenario and leads to calculated resistive power losses that are too high. More sophisticated modeling described later herein removes this assumption. Current is likely not uniform throughout the panel architecture because, for example, not all charges travel to the center of the panel area. Rather, light emitted around the edges of a device is likely due recombination of charge carriers that did not travel far into the panel area. However, the basic modeling is useful to calculate rough approximations.

As an example of calculating resistive power loss due to sheet resistance in an electrode, it is assumed that
Pixel Luminance L=2,000 cd/m$^2$
(Luminance of 2,000 cd/m$^2$ is about equivalent to luminous emittance of 6,000 lm/m$^2$)
Luminous Efficiency LE=60 cd/A
Operating Voltage=4.0 V
A square pixel contacted by a bus line on all sides
ITO sheet resistance=10 Ω/sq.
Power needs of the pixel=I×V
Power=[2,000 cd/m$^2$/60 cd/A]×[Pixel Area m$^2$]×4.0 V=66.66 W/m$^2$×Pixel Area So, for a Power Loss <5%, Power Loss <6.66 W/m²×Pixel Area.
Power Loss=I²R $$I^2R = (\text{Pixel Area})^2 \times J^2 R = (\text{Pixel Area})^2 \times [2{,}000 \text{ cd/m}^2 / 600 \text{ cd/A}]^2 \times 10\Omega = (\text{Pixel Area})^2 \times 11{,}111.11 \text{ W/m}^4$$

Figure 8:
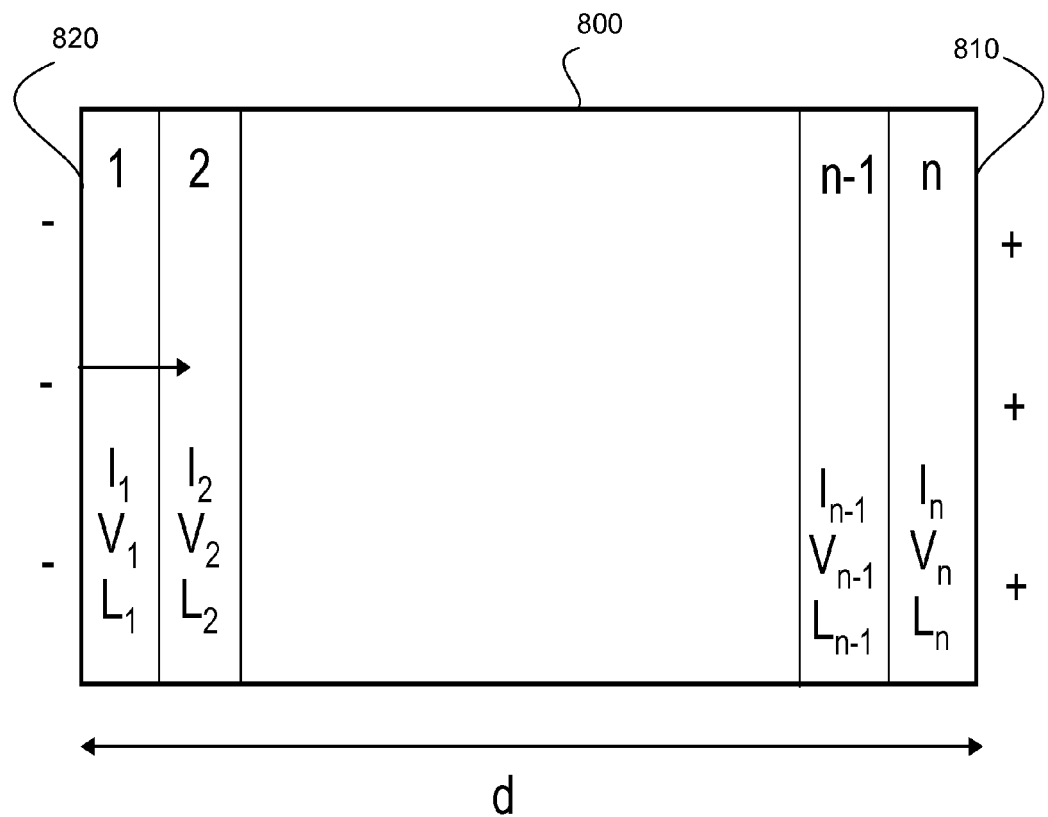
FIG. 8 shows an anode of an OLED as used in modeling.

So, (Pixel Area)²×11,111.11 W/m⁴<6.66 W/m²×Pixel Area
   Pixel Area×11,111.11 W/m⁴<6.66 W/m²
Pixel Area<5.994 cm²
So, for a square layout, each ITO pixel active emissive area is preferably <2.45 cm×2.45 cm
  Note that for a fluorescent pixel with half the LE (=30 cd/A), only half the Pixel Area is possible with the same luminance non-uniformity, using the assumptions of the basic modeling.
  The basic modeling described above is a simplification, which may be used for an initial assessment of resistive power loss. In this simple model, current (I) is assumed to be constant across the electrode. In a real device, current will decrease as the potential drop increases. This leads to reduced current where electrode resistance is higher, which in turn leads to luminance non-uniformity across the pixel. In addition, charge carriers recombine in the active emissive area to form exciton states. Therefore, at a greater distance from the electrode contact, fewer charges need to be transported. The simple model described above is therefore a worst case scenario for calculating a desirable pixel size. In more advanced models, variation in current across the pixel may be accounted for, and this leads to a larger and more accurate estimate of pixel area for the same resistive power loss.
  As an example of calculating resistive power loss due to resistance in bus lines using the simple model, it is assumed that:
1 cm×1 cm pixel area
15×15 array of 1 cm×1 cm pixels–total active area=225 cm²
Pixel Luminance L=2,000 cd/m²
Luminous Efficacy LE=60 cd/A
Operating Voltage=4.0 V.
Current provided to bus line on both ends of bus line, i.e., anode contacts on 2 sides of the lighting plate
gold bus lines with ρ=2.44×10⁻⁸ Ωm
Current along each bus line=[2,000 cd/m²/60 cd/A]×[0.01 m×0.075 m]/2=12.5 mA
Power supplied by each bus line=I×V=12.5 mA×4 V=50 mW
If we want <5% power loss as a result of resistive losses in the bus line, then the I²R power loss along the bus line is <2.5 mW.
R=ρL/A
I²R<2.5 mW, then (0.0125 A)²×(2.44×10⁻⁸ Ωm×0.075 m/Bus Line Area)<2.5 mW
Bus Line Area>1.14×10⁻¹⁰ m²
So, for a gold bus line of width 0.1 mm, a Bus Line Thickness>1.14 μm corresponds to <5% resistive power loss.
  The simple model of sheet resistance in a bus line described in the preceding paragraph is a simplification, which may be used for an initial assessment of resistive power loss. In this simple model, current (I) is assumed to be constant along the bus line. In a real device, current will decrease as the potential drop increases. This leads to reduced current where electrode resistance is higher, which in turn leads to luminance non-uniformity along the bus line. In addition, charge carriers recombine in the active emissive area to form exciton states. Therefore, at a greater distance along the bus line, fewer charges need to be transported. The simple model described in the preceding paragraph is therefore a worst case scenario for bus lines. In more advanced models, variation in current along the bus line must be included.
  Similar calculations may be performed readily for any given pixel and bus line configuration. For example, it can be readily and easily calculated, based on the electrode and bus line materials and dimensions, what the resistive power loss is. This calculation can be used to determine, for example, a panel area for given bus lines and pixel geometries above which resistive power losses exceed 10%, or whether any particular panel has resistive power loss in the OLED electrodes and bus lines that exceed 10%. Preferably, bus line and electrode materials and dimensions are chosen along with panel size such that total resistive losses in the bus lines and OLED electrodes are less than 10%.
  For many common materials and geometries, the results of such calculations are going to be about what is described above. From the calculations, it can be seen that, for the relatively resistive transparent conductive oxide electrode, and for typical materials used, it is preferred that every point on the first electrode is within about 2 cm of a bus line to which the first electrode is electrically connected. This is a reasonable estimate that describes many geometries for which resistive power loss in the TCO (transparent conductive oxide) electrode is expected to be less than 5%.
  More advanced modeling may be used to account for the change in current across the electrode.
  In the modeling used to account for change in current across the electrode, a square pixel with particular electrode contacts is assumed. It is understood that the results may be readily extended to other configurations. The pixel has a bus line contact to the anode of the OLED along one edge, and a bus line contact to the cathode of the OLED along the opposing edge. The anode and cathode are separated by the organic layers of the OLED. The anode is assumed to have a significant resistance (typically, it will be a TCO, such as indium tin oxide), while resistance of the cathode is neglected (typically, it will be a metal). FIG. 8 shows an anode of an OLED as used in the model. Anode 800 is a square with side of length d. The aspect ratio in FIG. 8 as illustrated is not necessarily accurate. Anode 800 is connected to a bus line along edge 810. The cathode (not shown) of the OLED, also a square with sides of length d and separated from the anode by the organic layers of the OLED, is connected to a bus line along edge 820. For purposes of modeling, anode 800 is divided into n stripes, numbered 1 through n. Each stripe has an associated current I, voltage V, and luminance L, indicated by a subscript, such that stripe "i" has a current a voltage $V_i$ and a luminance $L_i$.
  Using the model, the inputs are (a) an JVL relationship for an equivalent small area pixel of known active area, (b) sheet resistance of the anode (R in units of Ω/sq), (c) desired average luminance from the large area light panel, (d) light extraction enhancement, and (e) desired luminance uniformity. The model then calculates the distance (denoted by "d") from the anode to the cathode contact for a desired average luminance and luminance uniformity.
  The model works as follows:
  The pixel area is divided into a series of stripes of equal width. The stripe adjacent to the anode contact is Stripe n, the stripe adjacent to the cathode contact is Stripe 1. The first stripe has current=$I_1$=$J_1$×Stripe Area, voltage=$V_1$ and luminance=$L_1$. The second stripe has Voltage=$V_2$=$V_1$+($I_1$×R/n), where n is the total number of stripes and d is the distance from anode contact to cathode contact. For the numbers calculated in the example, n=100. This accounts for voltage drop across the first stripe. The third stripe has Voltage $V_3=V_2+(I_2 \times R/n)$ and so on until the nth stripe which has $V_n=V_{n-1}+(I_{n-1} \times R/n)$. For each stripe, the voltage $V_i$ can be calculated. The JVL curve of the equivalent small area test pixel can then be used to determine $I_i$ and $L_i$ for each stripe for the given $V_i$. Using the model, d and $L_1$ can be varied until the desired average luminance and luminance uniformity across the panel are recorded. In this example, and throughout the document, Luminance Uniformity is defined as $(Lmax(L_n)-Lmin(L_1))/Lmax(L_n)$. Using this definition, a lower value for Luminance Uniformity corresponds to a panel area with increasingly uniform emission. Average luminance is defined as:

$$L_{av} = \frac{1}{n}\sum_{i=1}^{n} L_i.$$

Once d and $L_1$ have been determined, $V_i$, $I_i$ and $L_i$ for each stripe can be calculated and used to determine the large area panel efficacy (lm/W) for a given average luminance and luminance non-uniformity. This is given by:

$$\eta_{panel} = \frac{\pi}{V_n}\sum_{i=1}^{n}\frac{L_i}{J_i}$$

Panel efficacy can then be compared to pixel efficacy at the same average luminance, to estimate the resistive power loss of the panel with the particular device architecture.

Figure 5:
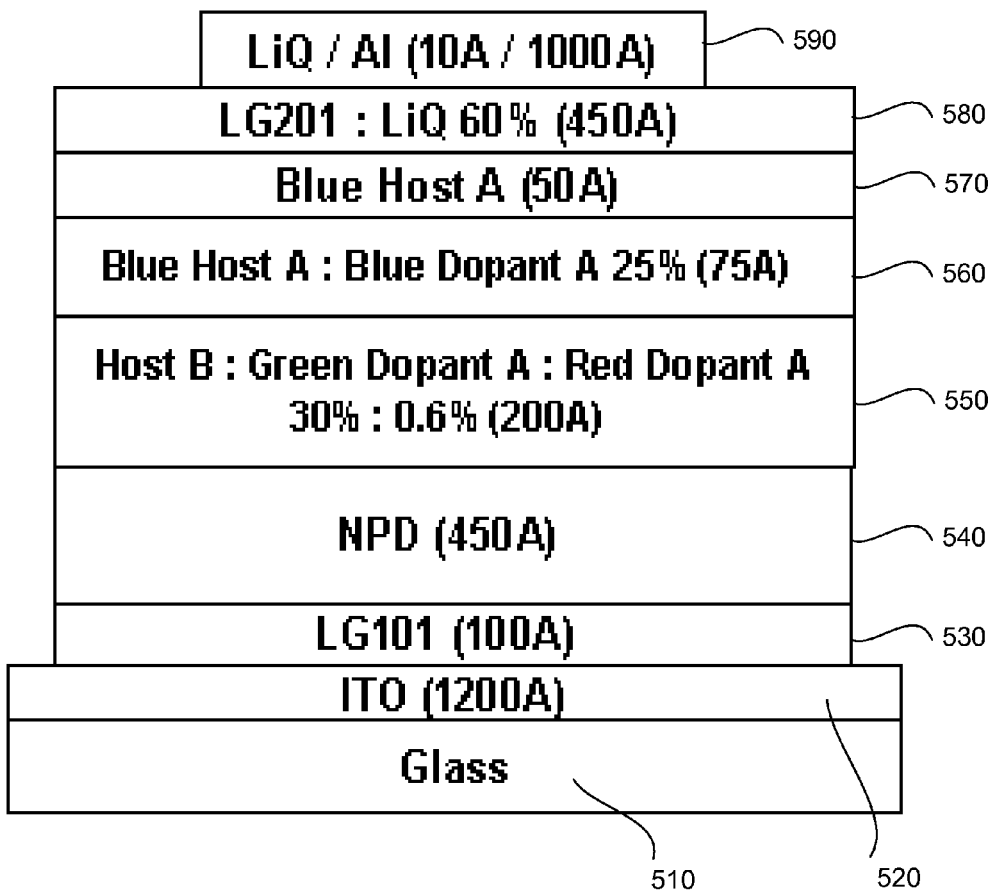
FIG. 5 shows a device architecture.

Table 3 shows measured JVL data for a small area phosphorescent white OLED pixel fabricated and tested at Universal Display Corporation ("UDC"), having the architecture shown in FIG. 5. This input data was used to calculate d and resistive power loss for a highly efficient phosphorescent light panel under various conditions. The results of this calculation are shown in Table 1. Table 4 shows JVL data for an equivalent small area white OLED pixel, calculated by assuming luminous efficiency is 2.5× lower. This is approximately what could be expected for an equivalent fluorescent device. This input data was used to calculate d and resistive power loss for a fluorescent light panel under various conditions. The results of this calculation are shown in Table 2. Note that pixel size has been estimated as $(2 \times d)^2$, which assumes that anode contacts can be made on both edges of the pixel and that the pixel is a square. All data includes 1.5× outcoupling enhancement.

TABLE 1

Simulation results for a large area light panel with phosphorescent emitters

| Luminance Uniformity | Average Luminance (Includes Outcoupling) [cd/m$^2$] | Sheet Resistance [Ω/sq] | Furthest Distance from Anode Contact (d) [cm] | Calculated Pixel Area $(2 \times d)^2$ [cm$^2$] | Panel Efficacy [lm/W] | Pixel Efficacy [lm/W] | Resistive Power Loss for Calculated Pixel Area [%] |
|---|---|---|---|---|---|---|---|
| 10% | 3,000 | 10 | 1.45 | 8.45 | 41.24 | 41.60 | 0.865% |
| 20% | 3,000 | 10 | 2.15 | 18.43 | 40.83 | 41.60 | 1.851% |
| 10% | 3,000 | 15 | 1.19 | 5.62 | 41.24 | 41.60 | 0.865% |
| 20% | 3,000 | 15 | 1.75 | 12.30 | 40.83 | 41.60 | 1.851% |
| 10% | 3,000 | 20 | 1.03 | 4.23 | 41.24 | 41.60 | 0.865% |
| 20% | 3,000 | 20 | 1.52 | 9.21 | 40.83 | 41.60 | 1.851% |
| 10% | 5,000 | 10 | 1.24 | 6.15 | 37.67 | 38.04 | 0.973% |
| 20% | 5,000 | 10 | 1.84 | 13.49 | 37.23 | 38.04 | 2.129% |
| 10% | 5,000 | 15 | 1.01 | 4.12 | 37.67 | 38.04 | 0.973% |
| 20% | 5,000 | 15 | 1.50 | 8.98 | 37.23 | 38.04 | 2.129% |
| 10% | 5,000 | 20 | 0.88 | 3.07 | 37.67 | 38.04 | 0.973% |
| 20% | 5,000 | 20 | 1.30 | 6.75 | 37.23 | 38.04 | 2.129% |

TABLE 2

Simulation results for a large area light panel with fluorescent emitters

| Luminance Uniformity | Average Luminance (Includes Outcoupling) [cd/m$^2$] | Sheet Resistance [Ω/sq] | Furthest Distance from Anode Contact (d) [cm] | Calculated Pixel Area $(2 \times d)^2$ [cm$^2$] | Panel Efficacy [lm/W] | Pixel Efficacy [lm/W] | Resistive Power Loss for Calculated Pixel Area [%] |
|---|---|---|---|---|---|---|---|
| 10% | 3,000 | 10 | 1.10 | 4.88 | 13.79 | 13.94 | 1.078% |
| 20% | 3,000 | 10 | 1.63 | 10.69 | 13.60 | 13.94 | 2.439% |
| 10% | 3,000 | 15 | 0.90 | 3.25 | 13.79 | 13.94 | 1.078% |
| 20% | 3,000 | 15 | 1.34 | 7.13 | 13.60 | 13.94 | 2.439% |
| 10% | 3,000 | 20 | 0.78 | 2.44 | 13.79 | 13.94 | 1.078% |
| 20% | 3,000 | 20 | 1.16 | 5.35 | 13.60 | 13.94 | 2.439% |
| 10% | 5,000 | 10 | 0.98 | 3.83 | 11.94 | 12.10 | 1.322% |
| 20% | 5,000 | 10 | 1.45 | 8.42 | 11.74 | 12.10 | 2.975% |
| 10% | 5,000 | 15 | 0.80 | 2.54 | 11.94 | 12.10 | 1.322% |

TABLE 2-continued

Simulation results for a large area light panel with fluorescent emitters

| Luminance Uniformity | Average Luminance (Includes Outcoupling) [cd/m$^2$] | Sheet Resistance [Ω/sq] | Furthest Distance from Anode Contact (d) [cm] | Calculated Pixel Area (2 × d)$^2$ [cm$^2$] | Panel Efficacy [lm/W] | Pixel Efficacy [lm/W] | Resistive Power Loss for Calculated Pixel Area [%] |
|---|---|---|---|---|---|---|---|
| 20% | 5,000 | 15 | 1.18 | 5.61 | 11.74 | 12.10 | 2.975% |
| 10% | 5,000 | 20 | 0.69 | 1.91 | 11.94 | 12.10 | 1.322% |
| 20% | 5,000 | 20 | 1.03 | 4.21 | 11.74 | 12.10 | 2.975% |

It can be seen from Tables 1 and 2 that resistive power loss is less significant than luminance non-uniformity. This is because current preferentially flows where the potential drop is smallest, so there is dimming where the potential drop is greatest. Operating at 3,000 cd/m$^2$ (approximately equivalent to 9,000 lm/m$^2$), a phosphorescent panel with pixel area=12.30 cm$^2$ and anode sheet resistance=15 Ω/sq. can have 20% luminance uniformity with 1.851% resistive power loss. An equivalent fluorescent panel with 2.5× lower luminous efficiency has 20% luminous uniformity with a smaller pixel area=7.13 cm$^2$ and resistive power loss=2.439%.

This model shows two distinct advantages of using highly efficient phosphorescent emitters in place of less efficient fluorescent emitters. Firstly, for the same luminance non-uniformity, a smaller resistive power loss can be realized. Secondly, for the same resistive power loss (or luminance non-uniformity), a larger pixel size can be realized. This enables larger pixel sizes on the panel, which means that panel fill factor can be higher using phosphorescent emitters, which enables high luminous emittance (lm/m$^2$), which has advantages in terms of efficacy, operational lifetime and fabrication costs.

Note that this model that accounts for non-uniform current is more advanced than the initial model. However, it may not account for all relevant factors. For instance, the model does not account for decrease in operating voltage with increased junction temperature (which arises from non-uniform heating across the panel). Nevertheless, the model may be used to show general trends in large area light panel performance, and to make reasonably accurate calculations of preferred parameters.

TABLE 3

JVL data for Phosphorescent Pixel-used to calculate data in Table 1.

| Pixel Area [cm$^2$] | Voltage [V] | Current Density [mA/cm$^2$] | Luminance [cd/m$^2$] |
|---|---|---|---|
| 0.02 | 0.2 | 0.00 | 0 |
| 0.02 | 0.4 | 0.00 | 0 |
| 0.02 | 0.6 | 0.00 | 0 |
| 0.02 | 0.8 | 0.00 | 0 |
| 0.02 | 1.0 | 0.00 | 0 |
| 0.02 | 1.2 | 0.00 | 0 |
| 0.02 | 1.4 | 0.00 | 0 |
| 0.02 | 1.6 | 0.00 | 0 |
| 0.02 | 1.8 | 0.00 | 0 |
| 0.02 | 2.0 | 0.00 | 0 |
| 0.02 | 2.2 | 0.00 | 0 |
| 0.02 | 2.4 | 0.00 | 0 |
| 0.02 | 2.6 | 0.00 | 0 |
| 0.02 | 2.8 | 0.01 | 2 |
| 0.02 | 3.0 | 0.03 | 10 |
| 0.02 | 3.2 | 0.11 | 43 |
| 0.02 | 3.4 | 0.35 | 143 |
| 0.02 | 3.6 | 0.90 | 363 |
| 0.02 | 3.8 | 1.89 | 749 |
| 0.02 | 4.0 | 3.36 | 1,310 |
| 0.02 | 4.2 | 5.31 | 2,030 |
| 0.02 | 4.4 | 7.76 | 2,900 |
| 0.02 | 4.6 | 10.70 | 3,930 |
| 0.02 | 4.8 | 14.20 | 5,100 |
| 0.02 | 5.0 | 18.20 | 6,420 |
| 0.02 | 5.2 | 22.90 | 7,890 |
| 0.02 | 5.4 | 28.20 | 9,510 |
| 0.02 | 5.6 | 34.20 | 11,300 |
| 0.02 | 5.8 | 41.00 | 13,200 |
| 0.02 | 6.0 | 48.60 | 15,300 |
| 0.02 | 6.2 | 57.30 | 17,500 |
| 0.02 | 6.4 | 66.80 | 19,900 |
| 0.02 | 6.6 | 77.30 | 22,500 |
| 0.02 | 6.8 | 88.90 | 25,200 |
| 0.02 | 7.0 | 102.00 | 28,000 |
| 0.02 | 7.2 | 116.00 | 31,000 |
| 0.02 | 7.4 | 131.00 | 34,100 |
| 0.02 | 7.6 | 148.00 | 37,400 |
| 0.02 | 7.8 | 166.00 | 40,800 |
| 0.02 | 8.0 | 187.00 | 44,400 |

TABLE 4

JVL data for Fluorescent Pixel-used to calculate data in Table 2. Luminous efficiency is 2.5× lower than for the Phosphorescent Pixel.

| Pixel Area [cm$^2$] | Voltage [V] | Current Density [mA/cm$^2$] | Luminance [cd/m$^2$] |
|---|---|---|---|
| 0.02 | 0.2 | 0.00 | 0 |
| 0.02 | 0.4 | 0.00 | 0 |
| 0.02 | 0.6 | 0.00 | 0 |
| 0.02 | 0.8 | 0.00 | 0 |
| 0.02 | 1.0 | 0.00 | 0 |
| 0.02 | 1.2 | 0.00 | 0 |
| 0.02 | 1.4 | 0.00 | 0 |
| 0.02 | 1.6 | 0.00 | 0 |
| 0.02 | 1.8 | 0.00 | 0 |
| 0.02 | 2.0 | 0.00 | 0 |
| 0.02 | 2.2 | 0.00 | 0 |
| 0.02 | 2.4 | 0.00 | 0 |
| 0.02 | 2.6 | 0.00 | 0 |
| 0.02 | 2.8 | 0.01 | 1 |
| 0.02 | 3.0 | 0.03 | 4 |
| 0.02 | 3.2 | 0.11 | 17 |
| 0.02 | 3.4 | 0.35 | 58 |
| 0.02 | 3.6 | 0.90 | 145 |
| 0.02 | 3.8 | 1.89 | 300 |
| 0.02 | 4.0 | 3.36 | 524 |
| 0.02 | 4.2 | 5.31 | 812 |
| 0.02 | 4.4 | 7.76 | 1160 |
| 0.02 | 4.6 | 10.70 | 1572 |
| 0.02 | 4.8 | 14.20 | 2040 |
| 0.02 | 5.0 | 18.20 | 2568 |
| 0.02 | 5.2 | 22.90 | 3156 |

TABLE 4-continued

JVL data for Fluorescent Pixel-used to calculate data in Table 2.
Luminous efficiency is 2.5x lower than for the Phosphorescent Pixel.

| Pixel Area [cm²] | Voltage [V] | Current Density [mA/cm²] | Luminance [cd/m²] |
|---|---|---|---|
| 0.02 | 5.4 | 28.20 | 3804 |
| 0.02 | 5.6 | 34.20 | 4520 |
| 0.02 | 5.8 | 41.00 | 5280 |
| 0.02 | 6.0 | 48.60 | 6120 |
| 0.02 | 6.2 | 57.30 | 7000 |
| 0.02 | 6.4 | 66.80 | 7960 |
| 0.02 | 6.6 | 77.30 | 9000 |
| 0.02 | 6.8 | 88.90 | 10080 |
| 0.02 | 7.0 | 102.00 | 11200 |
| 0.02 | 7.2 | 116.00 | 12400 |
| 0.02 | 7.4 | 131.00 | 13640 |
| 0.02 | 7.6 | 148.00 | 14960 |
| 0.02 | 7.8 | 166.00 | 16320 |
| 0.02 | 8.0 | 187.00 | 17760 |

Figure 3:
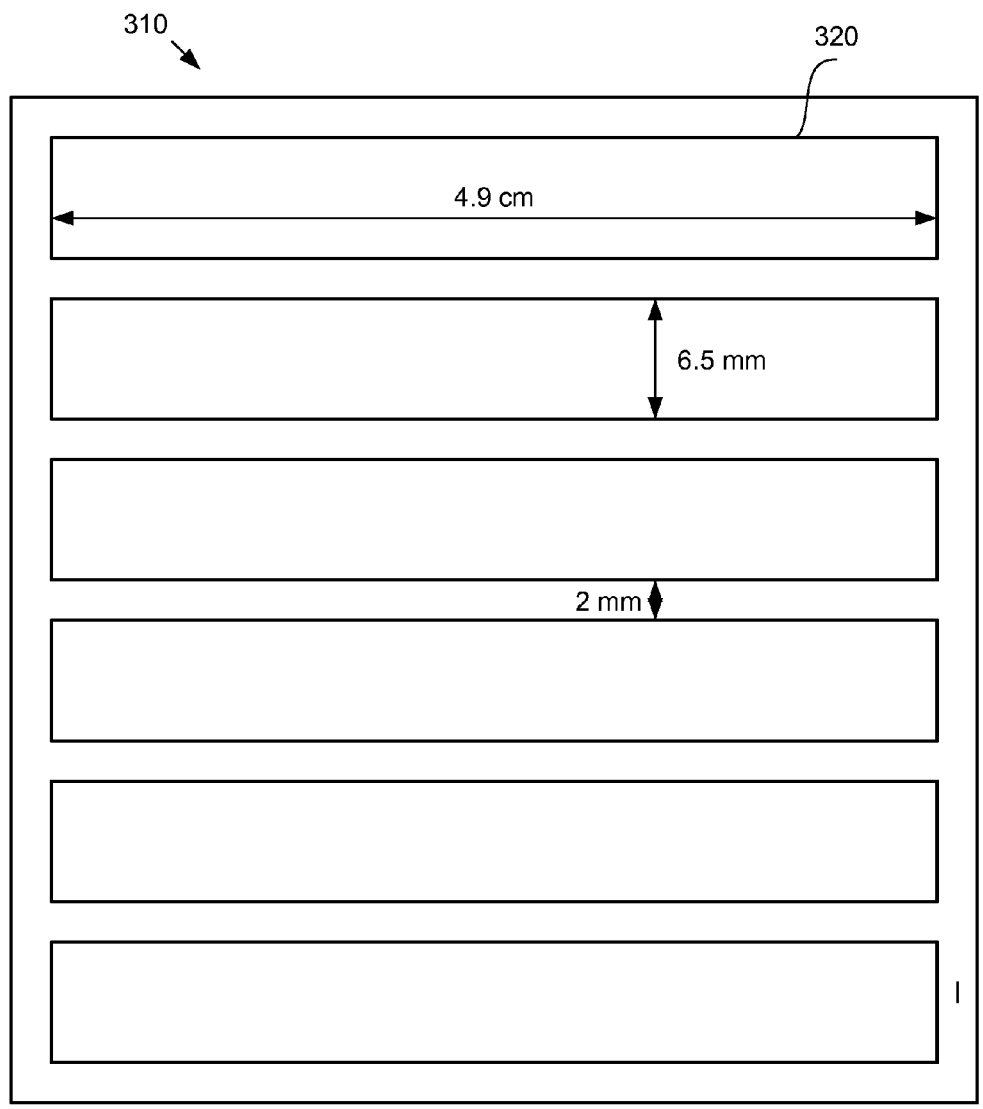
FIG. 3 shows a lighting panel.

FIG. 3 shows a panel layout for a lighting panel on a substrate 310. The active area is defined by six stripes 320. Each stripe is 4.9 cm in length and 6.5 mm in width. There is a separation of 2 mm between each stripe.

Figure 4:
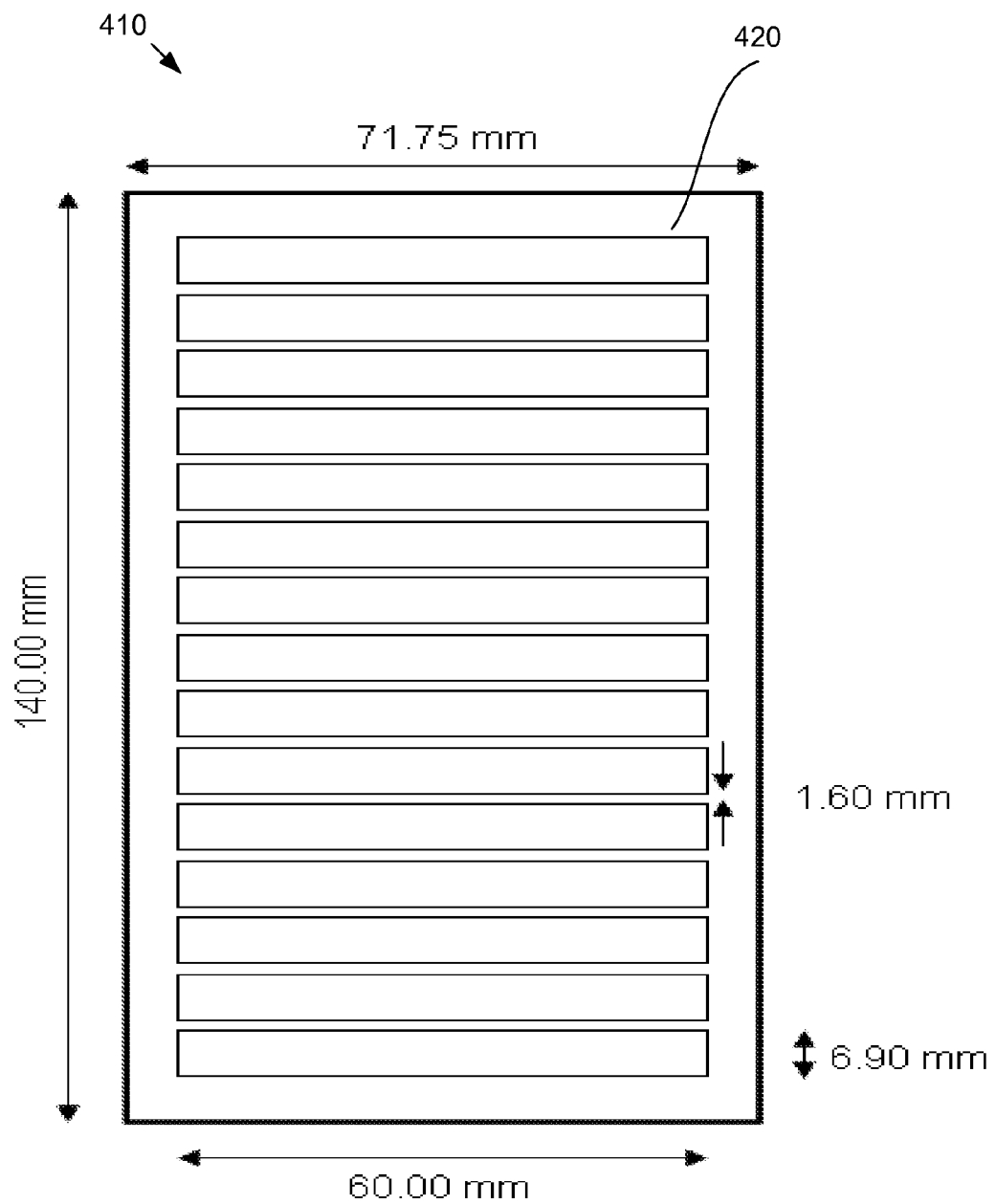
FIG. 4 shows a lighting panel.

FIG. 4 shows a panel layout for a lighting panel on a substrate 410. The active area is defined by fifteen stripes 420. Each stripe is 60 mm in length and 6.9 mm in width. There is a separation of 1.6 mm between each stripe.

Figure 6:
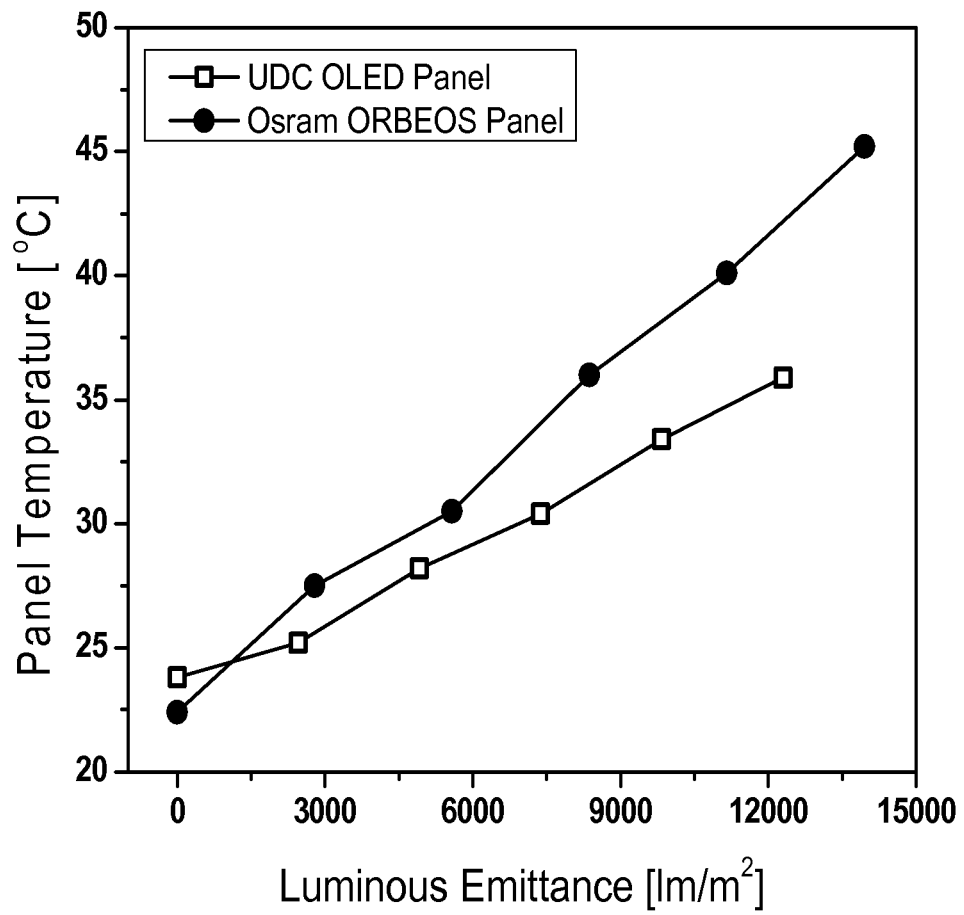
FIG. 6 shows plots of panel surface temperature v. luminous emittance for two different lighting panels.
Figure 7:
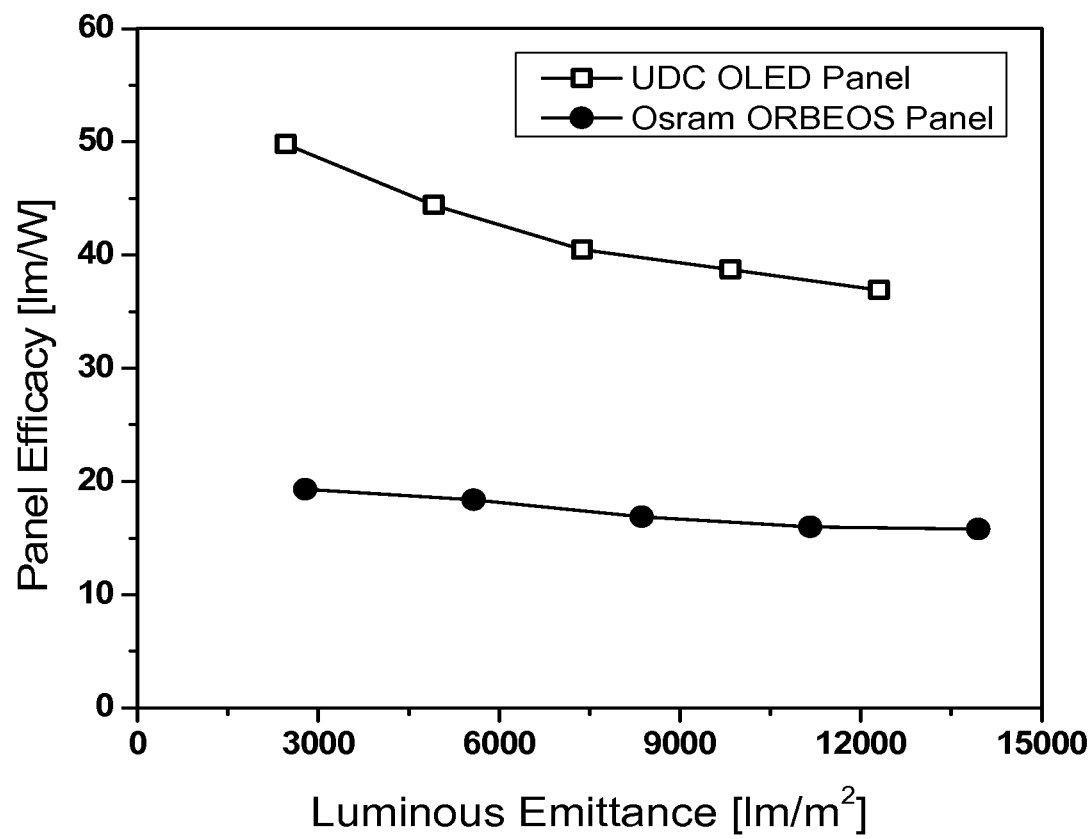
FIG. 7 shows plots of panel efficacy v. luminance emittance for two different lighting panels.

As used herein, the "area" used to quantify luminous emittance in units of "lumens per unit area" is the panel area of a surface defined by the outline of the active area on the panel. The panel area includes both active emissive device area and the areas in between devices, as distinguished from either just the device surface area (which would be the "fill factor" times the area defined by the outline of the active area). The "area" is not necessarily the total substrate area, which might include a significant region around the periphery with no devices that is not included in the surface defined by the outline of the active area. For example, with respect to FIG. 4, the relevant "area" used to calculate luminous emittance for the plots of FIGS. 6 and 7 is (15 stripes) (60 mm*6.9 mm)+(14 areas between devices) (60 mm*1.6 mm)=7554 mm². This is somewhat less than the total substrate area of 140 mm×71.75 mm=10045 mm², with the difference being due to the area that is outside the outline of the active area. While the area of the surface defined by the outline of the active area is 7554 mm², the active area by comparison is just 15 stripes×6.9 mm×60 mm=6210 mm². The fill factor of the panel would therefore be 6210/7554=82.2%.

FIG. 5 shows an exemplary device architecture. Devices were deposited by VTE onto 140 mm×71.75 mm substrates. The active area was defined by a polyimide grid deposited onto the anode prior to VTE deposition. The active area layout is shown in FIG. 4. The devices were fabricated on a glass substrate 510, and include, in order, an anode 520 (1200 Å thick ITO), a hole injection layer 530 (100 Å thick LG101, available from LG Chemicals of Korea), a hole transport layer 540 (450 Å thick NPD), a first emissive layer 550 (200 Å thick Host B doped with 30% Green Dopant A and 0.6% Red Dopant A), a second emissive layer 560 (75 Å thick Blue Host A doped with 25% Blue Dopant A), a blocking layer 570 (50 Å thick Blue Host A), an electron transport layer 580 (450 Å thick layer of 40% LG201, available from LG Chemicals of Korea and 60% LiQ), and an electron injection layer and a cathode 590 (10 Å thick layer of LiQ (lithium quinolate) and a 1000 Å thick layer of Al).

All emitting materials in the exemplary device architecture of FIG. 5 are phosphorescent, and three different organic emitting materials are included in the same device. Other preferred device architectures may involve the use of a fluorescent emitting material for one or more colors, most preferably blue. Other preferred architectures may also independently involve separate devices for the different emitting materials.

The chemical structures for each of the materials used for the exemplary device in FIG. 5 are shown below:

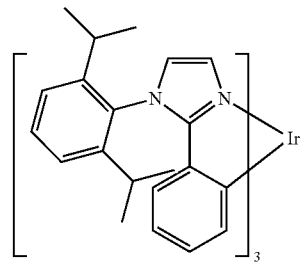

Blue Dopant A

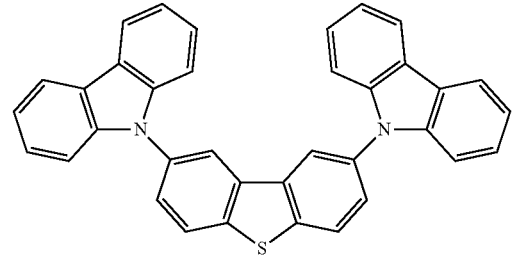

Blue Host A

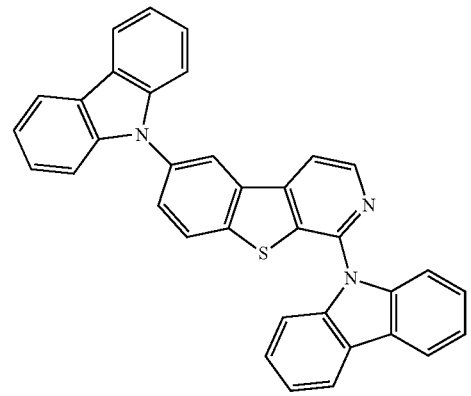

Host B

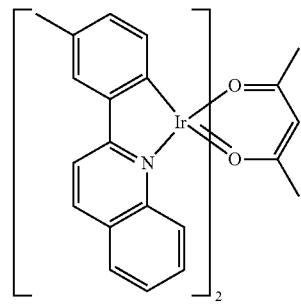

Red Dopant A

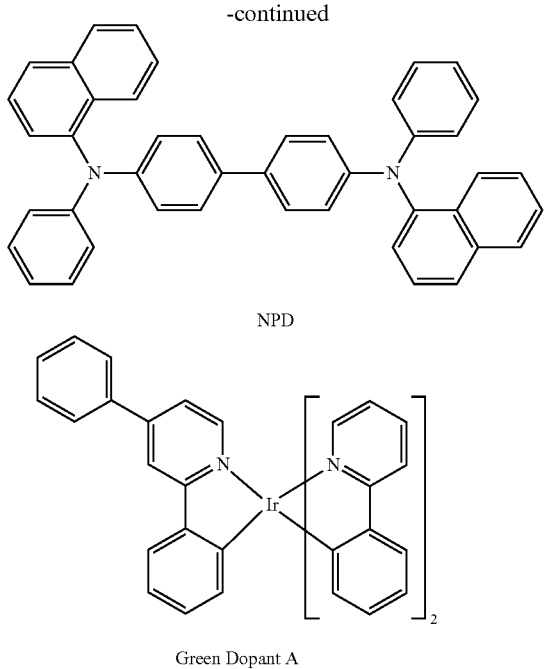

NPD

Green Dopant A

Measured Surface Temperatures for Exemplary Device

FIG. 6 shows plots of surface temperature versus luminance for two lighting panels. The UDC OLED Panel, represented by open squares, was a 140 mm×71.75 mm phosphorescent OLED lighting panel having the device architecture shown in FIG. 5, and the panel layout shown in FIG. 4. The panel has total thickness<2.0 mm including all encapsulation and light extraction systems. Operating at 12,300 lm/m², the panel has total electroluminescence spectrum providing emission with CRI Ra=80, CCT=3045 K with CIE 1931 (x, y)=(0.445, 0.426) and Duv=0.0075. The OSRAM ORBEOS lighting panel, represented by solid circles, is an equivalent fluorescent lighting panel that was commercially purchased, and which uses all organic fluorescent emitters. The panel had total thickness 2.1 mm including all encapsulation and light extraction systems. Operating at 2,790 lm/m², the panel has total electroluminescence spectrum providing emission with CRI Ra=73, CCT=2715 K with CIE 1931 (x, y)=(0.472, 0.435) and Duv=0.0075. The panel area is enclosed in a circle of diameter=79 mm. The panel area used to calculate lm/m² is 49.02 mm². This is distinct from the active area, which is approximately 45.59 mm² (giving a fill factor of 93%) and the total area of the substrate, which is approximately 63.45 cm².

FIG. 7 shows plots of power efficacy versus luminance for the two lighting panels discussed with respect to FIG. 6.

FIG. 6 shows the surface temperature rise versus luminance for a 140 mm×71.75 mm OLED lighting panel, whose efficacy is shown in FIG. 7. The data displayed in FIG. 6 is summarized in Tables 5(a) and (b) below. For full panel illumination, a 12.0° C. temperature rise in surface temperature was observed, from 23.8° C. when not illuminated to 35.8° C. when the luminous emittance was 12,300 lm/m². Power efficiency=36.9 lm/W at 12,300 lm/m². The surface temperature at 12,300 lm/m² is 12° C. higher than ambient room temperature. This low surface temperature enables extremely long panel lifetimes. FIG. 6 also shows data for an equivalent fluorescent lighting panel operating at the same surface temperature. For full panel illumination, a 22.8° C. rise in surface temperature was observed, from 22.4° C. when not illuminated to 45.2° C. when the luminous emittance is 13,950 lm/m². Power efficiency=15.8 lm/W at 13,950 lm/m². Both panels include a light extraction layer placed in optical contact with the glass surface. Light is emitted through the light extraction layer. The light extraction layer increases panel light output by a factor of ~1.5 for both panels.

Table 5 shows measured Panel Surface Temperature and Efficacy Versus Luminous Emittance for phosphorescent and fluorescent OLED lighting panels

TABLE 5

| Luminous Emittance [lm/m²] | Efficacy [lm/W] | Panel Surface Temp [° C.] | Temp Rise [° C.] |
|---|---|---|---|
| Phosphorescent OLED Lighting Panel | | | |
| 0 | | 23.8 | |
| 2460 | 49.8 | 25.2 | 1.4 |
| 4920 | 44.4 | 28.2 | 4.4 |
| 7380 | 40.5 | 30.4 | 6.6 |
| 9840 | 38.7 | 33.4 | 9.6 |
| 12300 | 36.9 | 35.8 | 12.0 |
| OSRAM ORBEOS fluorescent OLED Lighting Panel | | | |
| 0 | | 22.4 | |
| 2790 | 19.3 | 27.5 | 5.1 |
| 5580 | 18.4 | 30.5 | 8.1 |
| 8370 | 16.9 | 36 | 13.6 |
| 11160 | 16 | 40.1 | 17.7 |
| 13950 | 15.8 | 45.2 | 22.8 |

Calculated Junction Temperatures for Exemplary Device

Utilizing the same exemplary device that was used for the measurements of the surface temperature described above and shown in Table 5(a), the inventors have also calculated the junction temperature for range of luminance/luminous emittance values for the same device using another method, which is described in detail in U.S. application Ser. No. 13/047,220, which is incorporated by referenced in its entirety. Again for this exemplary device, the panel layout is shown in FIG. 4, the OLED device stack is shown in FIG. 5, the organic materials are described above in ¶148, and the exemplary device had a Fill Factor of the panel of 82%.

The exemplary OLED light panel was placed into an environment where the ambient temperature could be controlled. As used herein, the term "ambient temperature" is the temperature of an organic device in the absence of heating due to current density (or in some embodiments, the absence of material heating, which for some devices is heating that results in more than a 1° C. increase in junction temperature). In some embodiments, this may be the temperature of the surrounding environment (for instance, room temperature or the temperature in an oven). In some embodiments, the organic device could be placed onto a heating plate, and the temperature of the upper surface of the organic substrate (i.e. the surface of the substrate onto which the organics are disposed) could be used as the ambient temperature of the organic device or panel. This is preferred to taking the temperature directly from the heating plate, as there will most likely be an appreciable temperature drop across the substrate.

Figure 9:
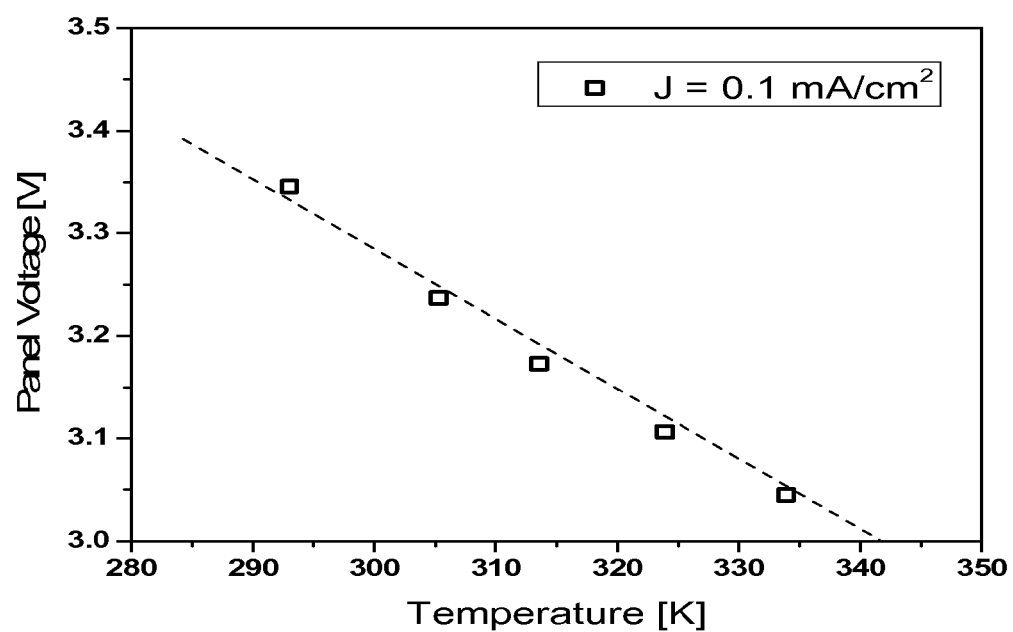
FIG. 9 shows a plot of panel voltage versus temperature for an exemplary device.

A non-heating current density=0.1 mA/cm² was then applied to the panel, and voltage was measured at a range of ambient temperatures. The data is shown in FIG. 9, where voltage is plotted against absolute temperature. In order to correlate voltage with temperature, a simple approach sometimes used by the inorganic LED industry is to fit a straight line to the data points. The gradient of the line then gives 1/K, where K is the K-factor given by $\Delta T_j = K \times \Delta V$. $\Delta T_j$ is the change in the junction temperature of the exemplary device and $\Delta V$ is the change in voltage measured across the panel. Using this approach for an OLED lighting panel, a value for the K-factor for the exemplary device was determined to be K=136.612° C./V at 0.1 mA/cm$^2$ for the panel. The dashed line shown in FIG. 9 is the straight line of best fit extrapolated to 20° C. The straight line provides a reasonable fit to the data points, with a least squares fit of=99.01%.

Figure 10:
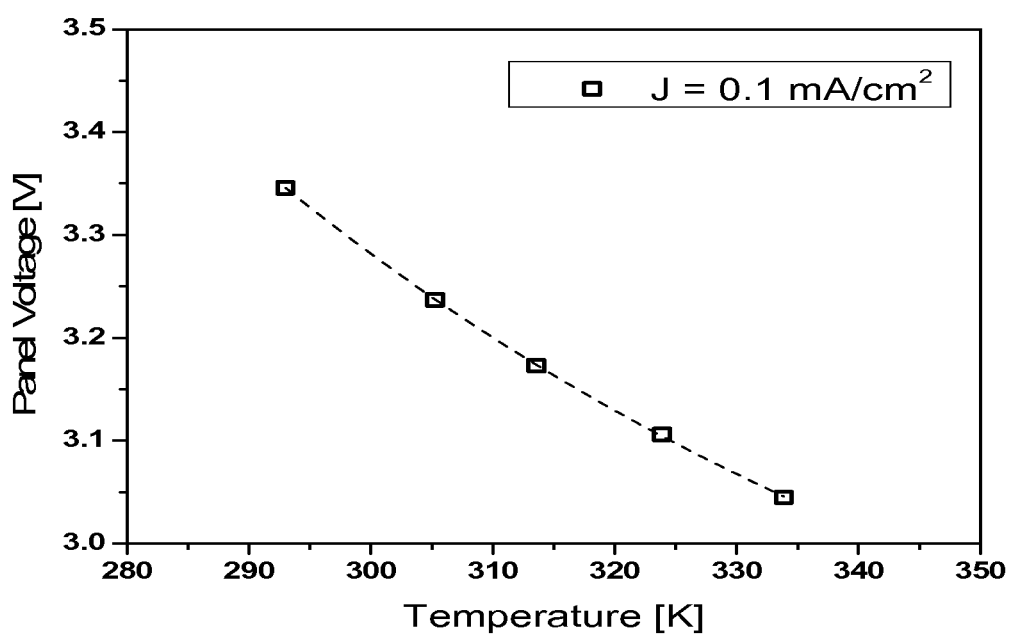
FIG. 10 shows a plot of panel voltage versus temperature for an exemplary device.

An alternative approach is fit an exponential curve to the data points. This is shown by the dashed line in FIG. 10. The curve follows the equation V=exp[−T/73.044]+2.6459, with a least squares fit of R$^2$=99.99%. This Arrhenius relationship is thought to arise at least in part from the temperature dependence of charge transport in the organic materials in the OLED device stack, where thermally activated hopping is thought to be the dominant mechanism. This is often a preferred approach when measuring OLED junction temperature because panel voltage and temperature typically follow an Arrhenius relationship in OLEDs, rather than an approximately linear relationship.

The next step performed by the inventors in this exemplary method for determining the junction temperature of the exemplary device was to determine the change in panel voltage, which can then be used to determine junction temperature. This was done by measuring an initial voltage ($V_1$) at a current density of J=0.1 mA/cm$^2$. The inventors then illuminated the exemplary OLED light panel (i.e. by supplying a heating current density) at a range of luminous emittance values shown in Table 6. For each of the luminous emittance levels, after the voltage across the exemplary device had stabilized (which was at voltage value that was lower than the initial voltage level $V_1$ due in part to the heating of the panel caused by the increase in current supplied to the device), the current density was then reduced back down to J=0.1 mA/cm$^2$. The voltage across the panel ($V_4$) was then measured. This data is shown in Table 6. Junction temperature is calculated in Table 6 using both fitting approaches (linear and exponential) described above. The linear fit is used to determine $\Delta T_j$, which can then be used with the equation $T_j$=RT+$\Delta T_j$. This is shown in Column 5 and Column 6. The exponential fit can be used to determine $T_j$ simply by substituting $V_4$ into the equation for the curve.

TABLE 6

Phosphorescent OLED Lighting Panel-Junction Temperature Data.

| Luminous Emittance [lm/m$^2$] | $V_1$ [V] | $V_4$ [V] | $\Delta V$ ($V_1 − V_4$) [V] | $\Delta T_j$ [° C.] Linear Fit | $T_j$ [° C.] [RT + $\Delta T_j$] Linear Fit | $T_j$ [° C.] Exponential Fit |
|---|---|---|---|---|---|---|
| 2,460 | 3.346 | 3.340 | 0.006 | 0.8 | 20.8 | 20.6 |
| 4,920 | 3.346 | 3.318 | 0.028 | 3.8 | 23.8 | 22.9 |
| 7,380 | 3.346 | 3.294 | 0.052 | 7.1 | 27.1 | 25.6 |
| 9,840 | 3.346 | 3.281 | 0.065 | 8.9 | 28.9 | 27.1 |
| 12,300 | 3.346 | 3.266 | 0.080 | 10.9 | 30.9 | 28.8 |

As can be seen from the comparison of the temperature rise as measured at the surface of the exemplary device (shown in Table 5(a)) and calculated at the junction of the exemplary device (shown using 2 fitting methods in Table 6), the two data sets are very consistent. It should be noted that room temperature (RT) for the junction temperature measurements (20° C.) was significantly lower than for the surface temperature measurements (23.8° C.), which may explain some of the discrepancies between the absolute temperatures of each of the temperature measurements.

For instance, at 9,840 lm/m$^2$, the surface temperature rise was measured to be 9.6° C., while the junction temperature rise was measured to be 8.9° C. (linear fit) or 7.1° C. (exponential fit). This demonstrates that it is possible to fabricate an OLED light panel with less than a 10° C. junction temperature rise when operated at 9,000 lm/m$^2$ without the use of heat management structures.

It should also be noted that in the measurements above, the surface temperatures that were measured were the highest surface temperatures of the exemplary device because the measurement is in the center of the central stripe. The junction temperature value determined is the average junction temperature across the entire OLED light panel.

Figure 11:
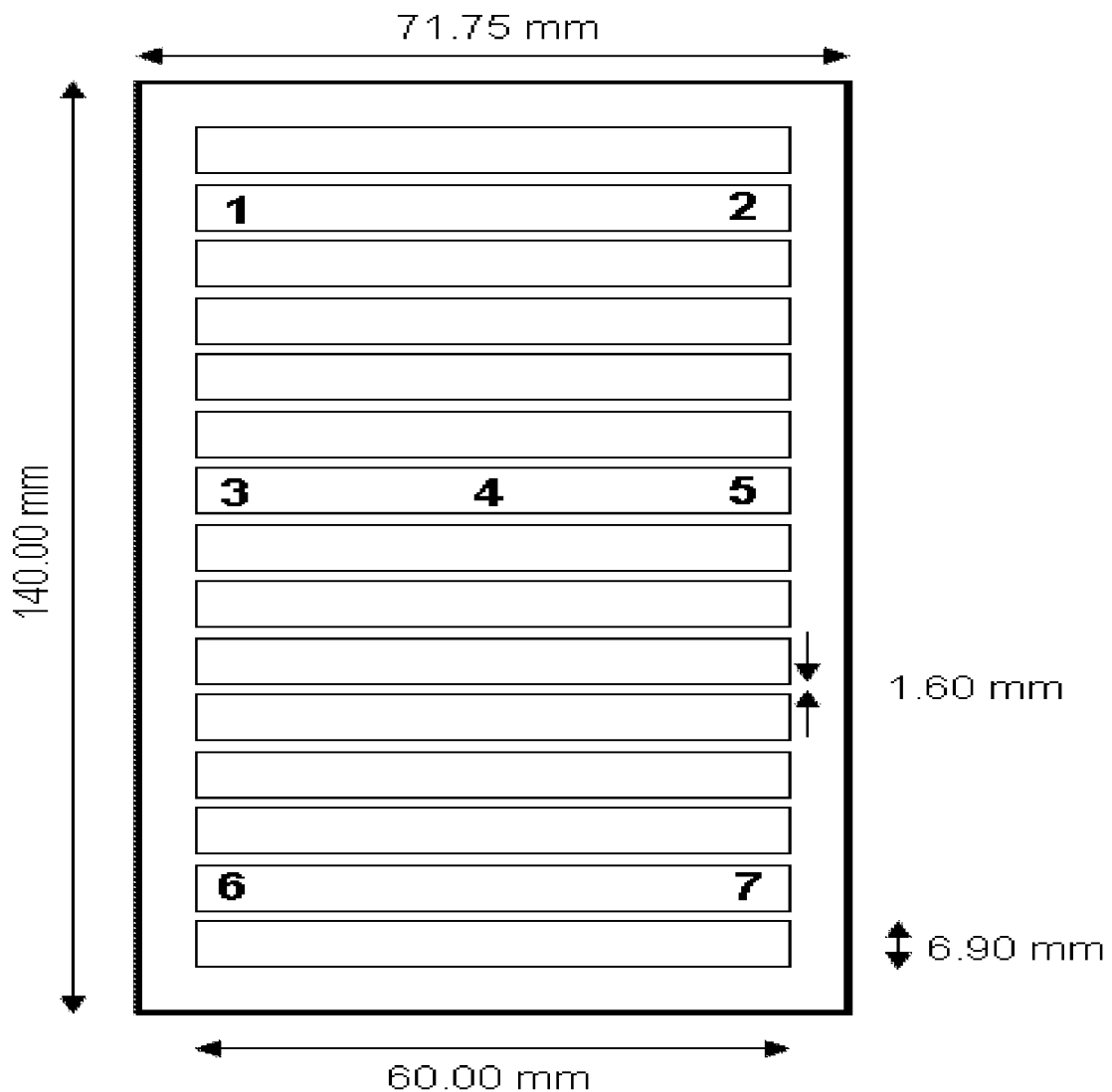
FIG. 11 shows a lighting panel layout.

The same exemplary OLED light panel was then operated at 12,300 lm/m$^2$ in an environment having an ambient temperature approximately equal to 20° C. Surface temperature measurements were taken at 7 different locations as shown in FIG. 11. The surface temperature at Point 4 was measured to be 32.6° C., which is 12.6° C. higher than room temperature. This is in comparison to a value of 12.1° C. measured previously (shown in Table 5(a)) in an environment where ambient temperature was approximately equal to 23.8° C. The average surface temperature across all 7 of the measured points was 29.5° C., which is 9.5° C. higher than ambient temperature. In comparison, the calculated average junction temperature was 30.9° C. (linear fit) or 28.8° C. (exponential fit), which is 10.9° C. higher (linear fit) or 8.8° C. higher (exponential fit) than ambient temperature under the same conditions. These numbers are all consistent. As noted above, average junction temperature is expected to be higher than average surface temperature, due in part to non-emissive area within the panel area and thermal resistance of the glass substrate. In this instance this effect is not clearly seen in part because surface temperature measurements were only taken at the center of lighting stripes, and not at the outer edges of the stripes, where temperature would be substantially lower.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A first device, comprising:
   a light panel, the light panel comprising:
      one or more organic light emitting devices,
   wherein at least 65 percent of the photons emitted by the organic light emitting devices are emitted from an organic phosphorescent emitting material; and
   wherein in an emitting material having emission with the highest energy peak in the emission spectrum, the energy gap between the highest LUMO through which an electron passes and the lowest HOMO through which a hole passes before forming an exciton on the emitting material is not more than 0.6 eV greater than the energy of the highest energy peak;
      an outcoupling enhancer optically coupled to each organic light emitting device.

2. The first device of claim 1, wherein the light panel is not attached to a heat management structure.

3. The first device of claim 1, wherein the light panel exhibits less than a 10 degree C. junction temperature rise when operated at 9,000 lm/m$^2$ without the use of heat management structures.

4. The device of claim 3, wherein the light panel is attached to a heat management structure.

5. The first device of claim 3, wherein the light panel is not attached to a heat management structure.

6. The first device of claim 1, wherein each organic light emitting device has an internal quantum efficiency of 70 to 100 percent.

7. The first device of claim 1, wherein each organic light emitting device has an internal quantum efficiency of 90 to 100 percent.

8. The first device of claim 1, wherein the light panel has a luminance emittance of at least 9,000 $lm/m^2$.

9. The first device of claim 1, wherein the light panel has a luminance emittance of at least 15,000 $lm/m^2$.

10. The first device of claim 1, wherein at least one of the organic light emitting devices further comprises:
    a first sublayer comprising a first organic host and a first organic emitting dopant, the first organic emitting dopant having a peak emissive wavelength in the visible range between 400 and 500 nm;
    a second sublayer disposed adjacent to the first sublayer and closer to an anode of the first device than the first sublayer, the second sublayer comprising a second organic host different from the first organic host, a second organic emitting dopant having a peak emissive wavelength in the visible range between 500 and 600 nm; and a third organic emitting dopant having a peak emissive wavelength in the visible range between 600 and 700 nm.

11. The first device of claim 1, wherein the first device is the light panel.

12. The first device of claim 1, wherein the first device is a consumer device.

13. The first device of claim 1, wherein the one or more organic light emitting devices are disposed on a substrate of a material selected from glass, plastic and metal.

14. The first device of claim 1, wherein all structures directly attached to the light panel consist essentially of materials selected from the group of glass and plastic.

15. The first device of claim 1, wherein the light panel has a panel area of at least 25 $cm^2$.

16. The first device of claim 1, wherein the first device includes one or more bus lines, each organic emitting device includes a first electrode comprising a transparent conductive oxide, and every point on the first electrode is within 2 cm of a bus line to which the first electrode is electrically connected.

17. The first device of claim 1, wherein the lighting panel has resistive power loss in bus lines and electrodes not more than 10%.

18. The first device of claim 1, wherein the lighting panel has resistive power loss in the electrodes not more than 2%.

19. The first device of claim 1, wherein the lighting panel has resistive power loss in the bus lines and electrodes not more than 5%.

20. The first device of claim 1, wherein the light panel when operating at 9,000 $lm/m^2$ has luminance uniformity <10% at a distance greater than 1.5 cm from the bus line to which the first electrode is electrically connected.

21. The first device of claim 1, wherein the light panel when operating at 9,000 $lm/m^2$ has luminance uniformity <10% at a distance greater than 1.5 cm from the bus line to which the first electrode is electrically connected and where the sheet resistance of the first electrode >10 $\Omega$/sq.

22. The first device of claim 1, wherein all emitting materials in the one or more organic light emitting devices are organic phosphorescent emitting materials.

23. The first device of claim 1, wherein at least one of the emitting materials in the one or more organic light emitting devices is an organic fluorescent emitting material having an emissive spectrum with a highest peak in the visible wavelength range between 400 nm and 500 nm.

24. The first device of claim 1, wherein the light panel has a CRI (Ra) of at least 80 and a Duv less than 0.008 when operated at 9,000 $lm/m^2$.

25. A method comprising:
    providing a first device, comprising a light panel, the light panel further comprising:
    one or more organic light emitting devices, wherein at least 65 percent of the photons emitted by the organic light emitting devices are emitted from an organic phosphorescent emitting material;
    an outcoupling enhancer optically coupled to each organic light emitting device;
        wherein, in an emitting material having emission spectrum with the highest energy peak in the emission spectrum, the energy gap between highest LUMO through which an electron passes and the lowest HOMO through which a hole passes before forming an exciton on the emitting material is not more than 0.6 eV greater than the energy of the highest energy peak;
    an outcoupling enhancer optically coupled to each organic light emitting device; operating the light panel at a luminance level of at least 9,000 $lm/m^2$.

26. The method of claim 25, wherein the light panel is not attached to a heat management structure.

27. The method of claim 25, wherein the light panel is capable of exhibiting less than a 10 degree C. rise in junction temperature rise when operated at 9,000 $lm/m^2$ without the use of heat management structures.

28. The method of claim 27, wherein the light panel is attached to a heat management structure.

29. The method of claim 27, wherein the light panel is not attached to a heat management structure.

* * * * *